(12) United States Patent
Yuasa et al.

(10) Patent No.: US 7,810,228 B2
(45) Date of Patent: Oct. 12, 2010

(54) METHOD FOR MANUFACTURING A MAGNETO-RESISTANCE EFFECT ELEMENT

(75) Inventors: Hiromi Yuasa, Kawasaki (JP); Hideaki Fukuzawa, Kawasaki (JP); Yoshihiko Fuji, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 278 days.

(21) Appl. No.: 11/822,435

(22) Filed: Jul. 5, 2007

(65) Prior Publication Data
US 2008/0005891 A1 Jan. 10, 2008

(30) Foreign Application Priority Data

Jul. 7, 2006 (JP) ............... P2006-188710

(51) Int. Cl.
*G11B 5/127* (2006.01)
*H04R 31/00* (2006.01)

(52) U.S. Cl. ............. 29/603.16; 29/603.07; 29/603.13; 29/603.14; 29/603.15; 29/603.18; 216/22; 216/48; 216/62; 216/65; 216/66; 360/324.1; 360/324.11; 360/324.12; 451/5; 451/41

(58) Field of Classification Search ............. 29/603.07, 29/603.09, 603.13–63.16, 603.18; 216/22, 216/48, 62, 65, 66; 360/324.1, 324.11, 324.12; 427/127–131
See application file for complete search history.

(56) References Cited

U.S. PATENT DOCUMENTS

| 5,304,975 | A | 4/1994 | Saito et al. |
|---|---|---|---|
| 5,313,186 | A | 5/1994 | Schuhl et al. |
| 5,448,515 | A | 9/1995 | Fukami et al. |
| 5,459,687 | A | 10/1995 | Sakakima et al. |
| 5,549,978 | A | 8/1996 | Iwasaki et al. |
| 5,768,181 | A | 6/1998 | Zhu et al. |
| 5,768,183 | A | 6/1998 | Zhu et al. |
| 6,002,553 | A | 12/1999 | Stearns et al. |
| 6,205,008 | B1 | 3/2001 | Gijs et al. |
| 6,400,537 | B2 | 6/2002 | Sakakima et al. |
| 6,473,275 | B1 | 10/2002 | Gill |
| 6,522,507 | B1 | 2/2003 | Horng et al. |
| 6,603,642 | B1 | 8/2003 | Arki et al. |
| 6,636,391 | B2 | 10/2003 | Watanabe et al. |
| 6,690,163 | B1 | 2/2004 | Hoshiya et al. |
| 6,937,446 | B2 | 8/2005 | Kamiguchi et al. |
| 7,046,489 | B2 | 5/2006 | Kamiguchi et al. |

(Continued)

FOREIGN PATENT DOCUMENTS

CN 1431651 A 7/2003

(Continued)

OTHER PUBLICATIONS

S. Sanvito, et al. "Breakdown of the Resistor Model of CPP-GMR in Magnetic Multilayered Nanostructures", Physical Review B, vol. 61, No. 20, May 15, 2000, pp. 14225-14228.

(Continued)

*Primary Examiner*—Paul D Kim
(74) *Attorney, Agent, or Firm*—Nixon & Vanderhye, PC

(57) ABSTRACT

An example method for manufacturing a magneto-resistance effect element involves irradiating inert gas ions to enhance an adhesive force between an area around an oxide layer and a metallic layer.

1 Claim, 19 Drawing Sheets

U.S. PATENT DOCUMENTS

| | | | |
|---|---|---|---|
| 7,116,529 | B2 | 10/2006 | Yoshikawa et al. |
| 7,196,877 | B2 | 3/2007 | Yoshikawa et al. |
| 7,223,485 | B2 | 5/2007 | Yuasa et al. |
| 7,331,100 | B2 | 2/2008 | Li et al. |
| 7,379,278 | B2 | 5/2008 | Koui et al. |
| 7,390,529 | B2 | 6/2008 | Li et al. |
| 7,514,117 | B2 * | 4/2009 | Fukuzawa et al. ............ 427/127 |
| 7,525,776 | B2 * | 4/2009 | Fukuzawa et al. ...... 360/324.12 |
| 7,602,592 | B2 * | 10/2009 | Fukuzawa et al. ...... 360/324.12 |
| 2002/0048127 | A1 | 4/2002 | Fukuzawa et al. |
| 2002/0048128 | A1 | 4/2002 | Kamiguchi et al. |
| 2002/0051380 | A1 | 5/2002 | Kamiguchi et al. |
| 2002/0073785 | A1 | 6/2002 | Prakash et al. |
| 2003/0035256 | A1 | 2/2003 | Hayashi et al. |
| 2003/0049389 | A1 | 3/2003 | Tsunekawa et al. |
| 2003/0123200 | A1 | 7/2003 | Nagasaka et al. |
| 2004/0021990 | A1 | 2/2004 | Koui et al. |
| 2004/0201929 | A1 | 10/2004 | Hashimoto et al. |
| 2006/0034022 | A1 | 2/2006 | Fukuzawa et al. |
| 2006/0098353 | A1 | 5/2006 | Fukuzawa et al. |
| 2006/0164764 | A1 | 7/2006 | Kamiguchi et al. |

FOREIGN PATENT DOCUMENTS

| | | |
|---|---|---|
| CN | 1746980 A | 3/2006 |
| EP | 1 626 393 A2 | 2/2006 |
| JP | 2000-215414 | 8/2000 |
| JP | 2002-076473 | 3/2002 |
| JP | 2002-208744 | 7/2002 |
| JP | 2003-086866 | 3/2003 |
| JP | 2004-153248 | 5/2004 |
| JP | 2004-214234 | 7/2004 |
| JP | 2006-054257 | 2/2006 |
| JP | 2006-135253 | 5/2006 |
| JP | 2006-319343 | 11/2006 |
| KR | 10-2006-0050327 | 5/2006 |

OTHER PUBLICATIONS

Didier Bozec, et al., "Mean Free Path Effects on the Current Perpendicular to the Plane Magnetoresistance of Magnetic Multilayers", Physical Review Letters, vol. 85, No. 6, Aug. 7, 2000, pp. 1314-1317.

B. Dieny, et al., "Magnetotransport Properties of Magnetically Soft Spin-Valve Structures (Invited)", J. Appl. Phys., vol. 69 (8), Apr. 15, 1991, pp. 4774-4779. (Abstract).

B. Dieny et al., "Giant Magnetoresistance of Magentically Soft Sandwiches: Dependence on Temperature and on Layer Thicknesses", Physical Review B, vol. 45, No. 2, Jan. 1, 1992, pp. 806-813. (Abstract).

D. Bozec, et al., "Comparative Study of the Magnetoresistance of MBE-Grown Multilayers: [Fe/Cu/Co/Cu]$_N$ and [Fe/Cu]$_N$ [Co/Cu]$_N$" Physical Review B, vol. 60, No. 5, Aug. 1, 1999, pp. 3037-3039. (Abstract).

Hideaki Fukuzawa, et al., "MR Ratio Rnhancement by NOL Current-Confined-Path Structures in CPP Spin Valves", IEEE Transactions on Magnetics, Jul. 2004, vol. 40, No. 4, pp. 2236-2238. (Abstract).

* cited by examiner (1) Enhancement of adhesion at interface between top pinned layer and bottom non-magnetic metallic layer (2) Enhancement of adhesion at interface between bottom non-magnetic metallic layer and insulator (3) Enhancement of adhesion at interface between metal path and insulator (4) Enhancement of adhesion at interface between insulator and top non-magnetic metallic layer (5) Enhancement of adhesion at interface between top non-magnetic metallic layer and free layer (6) Enhancement of adhesion between insulator and free layer without top non-magnetic metallic layer

METHOD FOR MANUFACTURING A MAGNETO-RESISTANCE EFFECT ELEMENT

CROSS-REFERENCE TO RELATED APPLICATIONS

This application is based upon and claims the benefit of priority from the prior Japanese Patent Application No. 2006-188710, filed on Jul. 7, 2006; the entire contents of which are incorporated herein by reference.

BACKGROUND OF THE INVENTION

1. Field of the Invention

The present invention relates to a method for manufacturing a magneto-resistance effect element which is configured such that a current is flowed in the direction perpendicular to the film surface thereof to detect the magnetization of the element and the magneto-resistance effect element.

2. Description of the Related Art

Recently, the performance of a magnetic device, particularly such as a magnetic head is enhanced by means of Giant Magneto-Resistive Effect (GMR). Particularly, since a spin valve film (SV film) can exhibit a larger GMR effect, the SV film has developed the magnetic device such as a magnetic head and MRAM (Magnetic Random Access Memory).

The "spin valve" film has such a structure as sandwiching a non-magnetic metal spacer layer between two ferromagnetic layers and is configured such that the magnetization of one ferromagnetic layer (often called as a "pinning layer" or "fixed magnetization layer") is fixed by the magnetization of an anti-ferromagnetic layer and the magnetization of the other ferromagnetic layer (often called as a "free layer" or "free magnetization layer") is rotated in accordance with an external magnetic field.

The spin valve film is employed for a CIP (Current I plane)-GMR element, a CPP (Current Perpendicular to Plane)-GMR element and a TMR (Tunneling Magneto Resistance) element. In the CIP-GMR element, a sense current is flowed to the SV film in the direction parallel to the film surface thereof. In the CPP-GMR element and the TMR element, a sense current is flowed to the SV film in the direction almost perpendicular to the film surface thereof. In view of the development of a high density recording head, attention is paid to such an element as configured so that the sense current is flowed perpendicular to the film surface.

In a metallic CPP-GMR element, since the SV film is composed of metallic films, the variation degree in resistance by the magnetization of the SV film becomes small so that weak magnetic (from a magnetic disk of high recording density) field can not be detected.

In contrast, such a CPP element as containing an oxide layer with current path therein (NOL: Nano-oxide layer) is proposed (Reference 1). In the CPP element, the element resistance and the MR variation degree of the element can be developed by means of CCP (Current-confined-path) element. Hereinafter, the CPP element is often called as a "CCP-CPP element".

[Reference 1] JP-A 2002-208744 (KOKAI)

Such a magnetic recording device as an HDD is widely available for a personal computer, a portable music player and the like. In the future, however, the reliability of the magnetic recording device is severely required when the usage of the magnetic recording device is increased and the high density recording is also developed. It is required, for example, that the reliability of the magnetic recording device is developed under a high temperature condition or a high speed operation. In this point of view, it is desired to much develop the reliability of the magnetic head in comparison with the conventional one.

Particularly, since the CCP-CPP element has a smaller resistance than the one of the conventional TMR element, the CCP-CPP element can be applied for a high end magnetic recording device of server enterprise requiring higher transfer rate. In the use of the high end magnetic recording device, both of the high density recording and the high reliability must be satisfied. Also, the high reliability under a higher temperature condition must be preferably satisfied. In other words, the CCP-CPP element is required to be used under the more severe condition (e.g., high temperature condition) and the more severe operation (e.g., the information being read out while the magnetic disk is rotated at high speed).

BRIEF SUMMARY OF THE INVENTION

An aspect of the present invention relates to a method for manufacturing a magneto-resistance effect element, including: forming a fixed magnetization layer; forming a free magnetization layer; and forming a spacer layer with an insulating layer and a non-magnetic metallic path penetrating through the insulating layer, includes: forming a first non-magnetic metallic layer; forming, a metallic layer on a surface of the first non-magnetic metallic layer; irradiating, onto the metallic layer, ions or plasma including at least one of oxygen and nitrogen and at least one selected from the group consisting of Ar, Xe, He, Ne, kr so as to convert the metallic layer into the insulating layer and the non-magnetic metallic path containing the first non-magnetic metallic layer; forming a second non-magnetic metallic layer on the non-magnetic metallic path; and irradiating ions or plasma onto at least one of the fixed magnetization layer, the first metallic layer, the metallic layer, the insulating layer converted from the second metallic layer and the second non-magnetic metallic layer.

In the aspect of the present invention, the ion beam irradiation or the plasma irradiation may be carried out for at least one of the layers listed above. Concretely, the ion beam irradiation or the plasma irradiation can be carried out for the fixed magnetization layer, the first metallic layer, the metallic layer during or after the formation of the second metallic layer, the insulating layer converted from the second metallic layer and/or the second non-magnetic metallic layer.

The ion beam irradiation or the plasma irradiation can be carried out for one of the layers listed above or two or more of the layers listed above.

The inventors had intensely studied to achieve the above-described object. As a result, the inventors found out the following fact of matter. In the CCP-CPP type magneto-resistance effect element as defined in the aspect of the present invention, the adhesion at the interface (1) between the pinned layer (fixed magnetization layer) and the bottom metallic layer composing the spacer layer, at the interface (2) between the bottom metallic layer and the insulating layer which compose the spacer layer, at the interface (3) between the insulating layer and the metal path formed in the insulating layer, at the interface (4) between the insulating layer and the top metallic layer composing the spacer layer and formed on the insulating layer and at the interface (5) between the top metallic layer and the free layer (free magnetization layer) is decreased in comparison with the adhesion at another interface.

Therefore, when a current is flowed in the stacking direction of the magneto-resistance effect element so as to drive the magneto-resistance effect element, some pre-breaking phenomena such as peeling-off may occur at the interface(s) as described above so as to deteriorate the characteristics of the layers as listed above. As a result, the deterioration in characteristics of the layers affects the spin dependent conduction so that the performance and reliability of the magneto-resistance effect element are reduced.

In this point of view, the ion beams or plasma is irradiated into the interface(s) between the layers as listed above so as to enhance the adhesion at the interface(s) therebetween. In this case, the performance and reliability of the magneto-resistance effect element can be improved. By using the present invention, therefore, the reliability of the CCP-CPP element can be enhanced.

The second non-magnetic metallic layer is configured such that in the spacer layer, the insulating layer (NOL layer) positioned almost at the center in the thickness direction of the spacer layer can be sandwiched by the metallic layers located above and below the insulating layer. The second non-magnetic metallic layer is not essential so as to be omitted as occasion demands.

The aspects of the present invention can be provided a magneto-resistance effect element which can be applied for a magnetic recording device of high density recording and develop the reliability and the method for manufacturing the same magneto-resistance effect element.

DESCRIPTION OF THE EMBODIMENTS

Hereinafter, the present invention will be described in detail with reference to the drawings. In these embodiments as described later, the composition of an alloy is designated by atomic %.

(Magneto-Resistance Effect Element)

Figure 1:
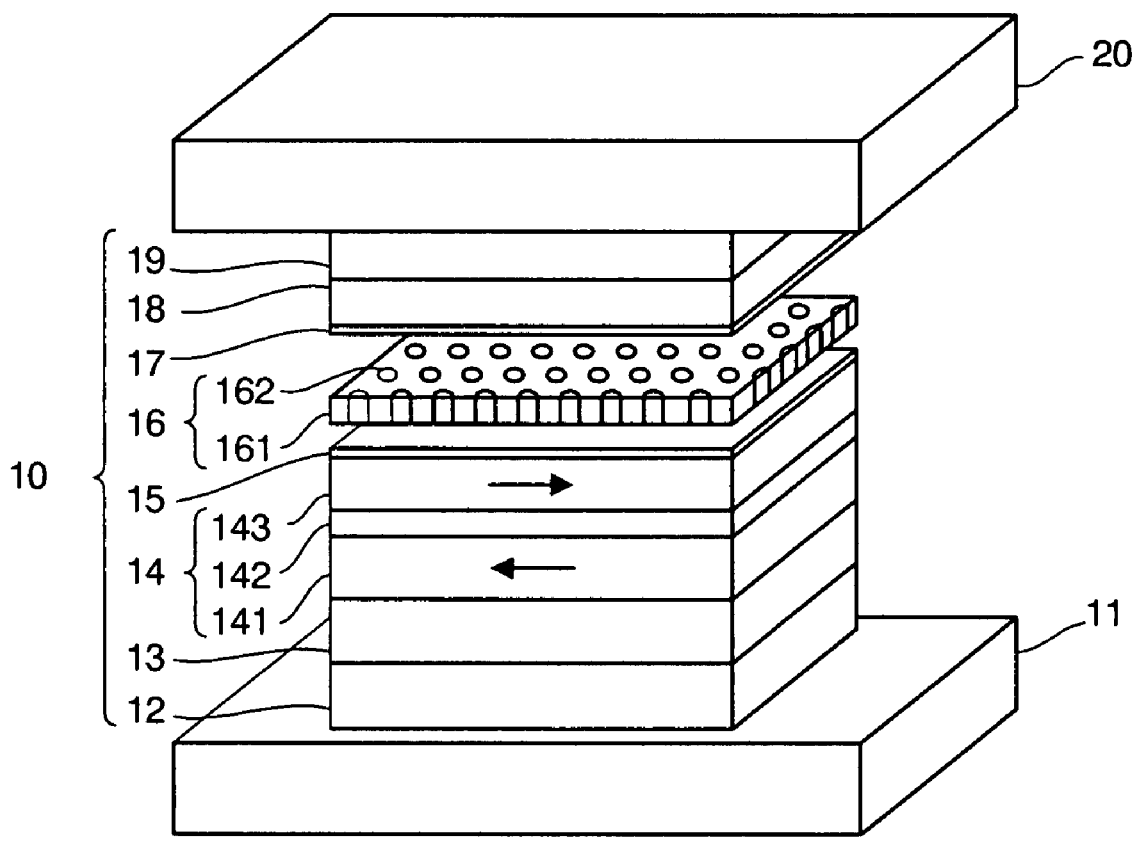
FIG. 1 is a perspective view illustrating a first embodiment of the magneto-resistance effect element by using the present invention.

FIG. 1 is a perspective view illustrating a magneto-resistance effect element (CCP-CPP type element) with an embodiment of the present invention. Some or all components throughout the drawings in the present application are schematically illustrated so that the illustrated thickness ratio for the components is different from the real thickness ratio for the components.

The magneto-resistance effect element illustrated in FIG. 1 includes a magneto-resistance effect element 10, a top electrode 11 and a bottom electrode 20 which are disposed so as to sandwich the magneto-resistance effect element 10. Herein, the illustrated stacking structure is formed on a base (not shown).

The magneto-resistance effect element 10 includes an underlayer 12, a pinning layer 13, a pinned layer 14, a bottom metallic layer 15, a spacer layer (CCP-NOL) 16 (an insulating layer 161 and a current confining path 162), a top metallic layer 17, a free layer 18 and a cap layer 19 which are subsequently stacked and formed. Among them, the pinned layer 14, the bottom metallic layer 15, the spacer layer 16, the top metallic layer 17 and the free layer 18 constitute a spin valve film which is configured such that the non-magnetic spacer layer is sandwiched between the two ferromagnetic layers. The bottom metallic layer 15, the extreme thin oxide layer 16 and the top metallic layer 17 constitute the spacer layer entirely. For clarifying the structural feature of the magneto-resistance effect element, the extreme thin oxide layer 16 is represented under the condition that the thin oxide layer 16 is separated from the upper and lower layers (the bottom metallic layer 15 and the top metallic layer 17).

Then, the components of the magneto-resistance effect element will be described. The bottom electrode 11 functions as an electrode for flowing a current in the direction perpendicular to the spin valve film. In real, the current can be flowed through the spin valve film in the direction perpendicular to the film surface thereof by applying a voltage between the bottom electrode 11 and the top electrode 20. The change in resistance of the spin valve film originated from the magneto-resistance effect can be detected by utilizing the current. In other words, the magnetization detection can be realized by the current flow. The bottom electrode 11 is made of a metallic layer with a relatively small electric resistance for flowing the current to the magneto-resistance effect element sufficiently.

The underlayer 12 may be composed of a buffer layer 12a and a seed layer 12b. The buffer layer 12a can be employed for the compensation of the surface roughness of the bottom electrode 11. The seed layer 12b can be employed for controlling the crystalline orientation and the crystal grain size of the spin valve film to be formed on the underlayer 12.

The buffer layer 12a may be made of Ta, Ti, W, Zr, Hf, Cr or an alloy thereof. The thickness of the buffer layer 12a is preferably set within 2 to 10 nm, more preferably set within 3 to 5 nm. If the buffer layer 12a is formed too thin, the buffer layer 12a can exhibit the inherent buffering effect. If the buffer layer 12a is formed too thick, the DC resistance not contributing to the MR variation may be increased. If the seed layer 12b can exhibit the buffering effect, the buffer layer 12a may be omitted. In a preferable example, the buffer layer 12a is made of a Ta layer with a thickness of 3 nm.

The seed layer 12b may be made of any material controllable for the crystalline orientation of (a) layer(s) to be formed thereon. For example, the seed layer 12b may be made preferably of a metallic layer with a fcc-structure (face-centered cubic structure), a hcp-structure (hexagonal close-packed structure) or a bcc-structure (body-centered cubic structure). Concretely, the seed layer 12b may be made of Ru with hcp-structure or NiFe with fcc-structure so that the crystalline orientation of the spin valve film to be formed thereon can be rendered an fcc (111) faced orientation. In this case, the crystalline orientation of the pinning layer 13 (e.g., made of PtMn) can be rendered an fct-structure (face-centered tetragonal structure)-regulated orientation or a bcc (110) faced orientation.

In order to exhibit the inherent seeding function of the seed layer 12b of enhancing the crystalline orientation sufficiently, the thickness of the seed layer 12b is set preferably within 1 to 5 nm, more preferably within 1.5 to 3 nm. In a preferable example, the seed layer 12b may be made of a Ru layer with a thickness of 2 nm.

The crystalline orientation for the spin valve film and the pinning layer 13 can be measured by means of X-ray diffraction. For example, the FWHMs (full width at half maximum) in X-ray rocking curve of the fcc (111) peak of the spin valve film, the fct (111) peak or the bcc (110) peak of the pinning layer 13 (PtMn) can be set within a range of 3.5 to 6 degrees, respectively under good crystallinity. The dispersion of the orientation relating to the spin valve film and the pinning layer can be recognized by means of diffraction spot using cross section TEM.

The seed layer 12b may be made of a NiFe-based alloy (e.g., $Ni_XFe_{100-X}$: X=90 to 50%, preferably 75 to 85%) layer or of a NiFe-based non-magnetic $((Ni_XFe_{100-X})_{100-Y}X_Y$: X=Cr, V, Nb, Hf, Zr, Mo)) layer. In the latter case, the addition of the third element "X" renders the seed layer 12b non-magnetic. The crystalline orientation of the seed layer 12b of the NiFe-based alloy can be enhanced easily so that the FWHM in X-ray rocking curve can be rendered within a range of 3-5 degrees.

The seed layer 12b functions not only as the enhancement of the crystalline orientation, but also as the control of the crystal grain size of the spin valve film. Concretely, the crystal grain size of the spin valve film can be controlled within a range of 5 to 40 nm so that the fluctuation in performance of the magneto-resistance effect element can be prevented, and thus, the higher MR variation ratio can be realized even though the magneto-resistance effect element is downsized.

The crystal grain size of the spin valve film can be determined on the crystal grain size of the layer formed on the seed layer 12b by means of cross section TEM. In the case of a bottom type spin valve film where the pinning layer 14 is located below the spacer layer 16, the crystal grain size of the spin valve film can be determined on the crystal grain size of the pinning layer 13 (antiferromagnetic layer) or the pinned layer 14 (fixed magnetization layer) to be formed on the seed layer 12b.

With a reproducing head in view of high recording density, the element size is set to 100 nm or below, for example. Therefore, if the crystal grain size is set larger for the element size, the element characteristics may be fluctuated. In this point of view, it is not desired that the crystal grain size of the spin valve film is set larger than 40 nm. Concretely, the crystal grain size of the spin valve film is set preferably within 5 to 40 nm, more preferably within 5 to 20 nm.

Too large crystal grain size may cause the decrease of the number of crystal grain per element surface so as to cause fluctuation in characteristics of the reproducing head. With the CCP-CPP element forming a current confining path, it is not desired to increase the crystal grain size than a prescribed grain size. In contrast, too small crystal grain size may deteriorate the crystalline orientation. In this point of view, it is required that the crystal grain size is determined in view of the upper limited value and the lower limited value, e.g., within a range of 5 to 20 nm.

With the use of MRAM, however, the element size may be increased to 100 nm or over so that the crystal grain size can be increased to about 40 nm without the above-mentioned problem. Namely, if the seed layer 12b is employed, the crystal grain size may be increased than the prescribed grain size.

In order to set the crystal grain size within 5 to 20 nm, the seed layer 12b may be made of a Ru layer with a thickness of 2 nm or a NiFe-based non-magnetic $((Ni_XFe_{100-X})_{100-Y}X_Y$: X=Cr, V, Nb, Hf, Zr, Mo, preferably y=0 to 30%)) layer.

In contrast, in the case that the crystal grain size is increased more than 40 nm and thus, is rendered coarse, the content of the third additive element is preferably increased more than the value described above. For example, with NiFeCr alloy, the content of Cr is preferably set within 35 to 45% so as to set the composition of the NiFeCr alloy to the composition exhibiting intermediate phase structure between the fcc-structure and the bcc-structure. In this case, the resultant NiFeCr layer can have the bcc-structure.

As described above, the thickness of the seed layer 12b is set preferably within 1 to 5 nm, more preferably within 1.5 to 3 nm. Too thin seed layer 12b may deteriorate the crystalline orientation controllability. In contrast, too thick seed layer 12b may increase the DC resistance of the element and rough the interface for the spin valve film.

The pinning layer 13 functions as applying the unidirectional anisotropy to the ferromagnetic layer to be the pinned layer 14 on the pinning layer 13 and fixing the magnetization of the pinned layer 14. The pinning layer 13 may be made of an antiferromagnetic material such as PtMn, PdPtMn, IrMn, RuRhMn, FeMn, NiMn. In view of the use of the element as a high density recording head, the pinning layer 13 is preferably made of IrMn because the IrMn layer can apply the unidirectional anisotropy to the pinned layer 14 in comparison with the PtMn layer even though the thickness of the IrMn layer is smaller than the thickness of the PtMn layer. In this point of view, the use of the IrMn layer can reduce the gap width of the intended element for high density recording.

In order to apply the unidirectional anisotropy with sufficient intensity, the thickness of the pining layer 13 is appropriately controlled. In the case that the pinning layer 13 is made of PtMn or PdPtMn, the thickness of the pinning layer 13 is set preferably within 8 to 20 nm, more preferably within 10 to 15 nm. In the case that the pinning layer 13 is made of IrMn, the unidirectional anisotropy can be applied even though the thickness of the pinning layer 13 of IrMn is set smaller than the thickness of the pinning layer 13 of PtMn. In this point of view, the thickness of the pinning layer 13 of IrMn is set preferably within 4 to 18 nm, more preferably within 5 to 15 nm. In a preferred embodiment, the thickness of the IrMn pinning layer 13 is set to 10 nm.

The pinning layer 13 may be made of a hard magnetic layer instead of the antiferromagnetic layer. For example, the pinning layer 13 may be made of CoPt (Co=50 to 85%), $(Co_xPt_{100-X})_{100-Y}Cr_Y$: X=50 to 85%, Y=0 to 40%) or FePt (Pt=40 to 60%). Since the hard magnetic layer has a smaller specific resistance, the DC resistance and the surface resistance RA of the element can be reduced.

In a preferred embodiment, the pinned layer (fixed magnetization layer), 14 is formed as a synthetic pinned layer composed of the bottom pinned layer 141 (e.g., $Co_{90}Fe_{10}$ 3.5 nm), the magnetic coupling layer 142 (e.g., Ru) and the top pinned layer 143 (e.g., $Fe_{50}Co_{50}$ 1 nm/Cu 0.25 nm×2/$Fe_{50}Co_{50}$ 1 nm). The pinning layer 13 (e.g., IrMn layer) is coupled via magnetic exchange with the bottom pinned layer 141 formed on the pinning layer 13 so as to apply the unidirectional anisotropy to the bottom pinned layer 141. The bottom pinned layer 141 and the top pinned layer 143 which are located under and above the magnetic coupling layer 142, respectively, are strongly magnetically coupled with one another so that the direction of magnetization in the bottom pinned layer 141 becomes anti-paralleled to the direction of magnetization in the top pinned layer 143.

The bottom pinned layer 141 may be made of $Co_xFe_{100-X}$ alloy (x=0 to 100), $Ni_xFe_{100-X}$ (X=0 to 100) or an alloy thereof containing a non magnetic element. The bottom pinned layer 141 may be also made of a single element such as Co, Fe, Ni or an alloy thereof.

It is desired that the magnetic thickness (saturated magnetization Bs×thickness t (Bs·t)) of the bottom pinned layer 141 is set almost equal to the one of the top pinned layer 143. Namely, it is desired that the magnetic thickness of the top pinned layer 143 corresponds to the magnetic thickness of the bottom pinned layer 141. For example, when the top pinned layer 143 of $Fe_{50}Co_{50}$ 1 nm/Cu 0.25 nm×2/$Fe_{50}Co_{50}$ 1 nm is employed, the magnetic thickness of the top pinned layer 143 is set to 2.2 T×3 nm=6.6 Tnm because the saturated magnetization of the top pinned layer 143 is about 2.2 T. When the bottom pinned layer 141 of $Co_{90}Fe_{10}$ is employed, the thickness of the bottom pinned layer 141 is set to 6.6 Tnm/1.8 T=3.66 nm for the magnetic thickness of 6.6 Tnm because the saturated magnetization of $Co_{90}Fe_{10}$ is about 1.8 T. In this point of view, it is desired that the thickness of the bottom pinned layer 141 made of $Co_{90}Fe_{10}$ is set to about 3.6 nm.

The thickness of the bottom pinned layer 141 is preferably set within 2 to 5 nm in view of the magnetic strength of the unidirectional anisotropy relating to the pinning layer 13 (e.g., IrMn layer) and the magnetic strength of the antiferromagnetic coupling between the bottom pinned layer 141 and the top pinned layer 143 via the magnetic coupling layer 142 (e.g., Ru layer). Too thin bottom pinned layer 141 causes the decrease of the MR variation ratio. In contrast, too thick bottom pinned layer 141 causes the difficulty of obtaining the unidirectional anisotropy magnetic field requiring for the operation of the element. In a preferred embodiment, the bottom pinned layer 141 may be made of a $Co_{90}Fe_{10}$ layer with a thickness of 3.4 nm.

The magnetic coupling layer 142 (e.g., Ru layer) causes the antiferromatic coupling between the bottom pinned layer 141 and the top pinned layer 143 which are located under and above the magnetic coupling layer 142. In the case that the magnetic coupling layer 142 is made of the Ru layer, the thickness of the Ru layer is preferably set within 0.8 to 1 nm. Only if the antiferromagnetic coupling between the pinned layers located under and above the magnetic coupling layer 142 can be generated, the magnetic coupling layer 142 may be made of another material except Ru or the thickness of the magnetic coupling layer 142 may be varied within 0.3 to 0.6 nm instead of the thickness range of 0.8 to 1 nm. The former thickness range of 0.3 to 0.6 nm corresponds to the first peak of RKKY (Runderman-Kittel-Kasuya-Yoshida), and the latter thickness range of 0.8 to 1 nm corresponds to the second peak of RKKY. With the thickness range of the first peak of RKKY, the magnetic coupling layer 142 can exhibit an extremely large antiferromagnetic fixing strength, but the allowable thickness range of the magnetic coupling layer 142 is reduced. In a preferred embodiment, the magnetic coupling layer 142 may be made of the Ru layer with a thickness of 0.9 nm so as to realize the antiferromagnetic coupling for the pinned layers stably.

The top pinned layer 143 may be made of $Fe_{50}Co_{50}$ 1 nm/Cu 0.25 nm×2/$Fe_{50}Co_{50}$ 1 nm. The top pinned layer 143 composes the spin dependent scattering unit. The top pinned layer 143 can contribute directly to the MR effect, and thus, the material and thickness of the top pinned layer 143 are important so as to realize a large MR variation ratio. The magnetic material of the top pinned layer 143 to be positioned at the interface for the CCP-NOL layer 16 is important in view of the contribution of the spin dependent interface scattering.

Then, the effect/function of the top pinned layer 143 of the $Fe_{50}Co_{50}$ layer with bcc-structure will be described. In this case, since the spin dependent interface scattering is enhanced, the MR variation ratio can be enhanced. As the FeCo-based alloy with bcc-structure, a $Co_xFe_{100-X}$ alloy (X=30 to 100) or a similar CoFe-based alloy containing an additive element can be exemplified. Among them, a $Fe_{40}Co_{60}$ alloy through a $Fe_{60}Co_{40}$ alloy may be employed in view of the above-described requirements.

In the case that the top pinned layer 143 is made of the magnetic layer with bcc-structure easily exhibiting the large MR variation ratio, the thickness of the top pinned layer 143 is preferably set to 1.5 nm or over so as to maintain the bcc-structure thereof stably. Since the spin valve film is made mainly of a metallic material with fcc-structure or fct-structure, only the top pinned layer 143 may have the bcc-structure. In this point of view, too thin top pinned layer 143 can not maintain the bcc-structure thereof stably so as not to obtain the large MR variation ratio.

Herein, the top pinned layer 143 is made of the $Fe_{50}Co_{50}$ layers and the extremely thin Cu layers. The total thickness of the $Fe_{50}Co_{50}$ layers is 3 nm and each Cu layer is formed on the corresponding $Fe_{50}Co_{50}$ layer with a thickness of 1 nm. The thickness of the Cu layer is 0.25 nm and the total thickness of the top pinned layer 143 is 3.5 nm.

It is desired that the thickness of the top pinned layer 143 is set to 5 nm or below so as to generate a large pinning (fixing) magnetic field. In view of the large pinning (fixing) magnetic field and the stability of the bcc-structure in the top pinned layer 143, the thickness of the top pinned layer 143 is preferably set within 2 to 4 nm.

The top pinned layer 143 may be made of a $Co_{90}Fe_{10}$ alloy with fcc-structure or a Co alloy with hcp-structure which used to be widely employed for a conventional magneto-resistance effect element, instead of the magnetic material with the bcc-structure. The top pinned layer 143 can be made of a single element such as Co, Fe, Ni or an alloy containing at least one of Co, Fe, Ni. In view of the large MR variation ratio of the top pinned layer 143, the FeCo alloy with the bcc-structure, the Co alloy containing Co element of 50% or over and the Ni alloy containing Ni element of 50% or over are in turn preferable.

In this embodiment, the top pinned layer 143 is made of the magnetic layers (FeCo layers) and the non magnetic layers (extremely thin Cu layers). In this case, the top pinned layer 143 can enhance the spin dependent scattering effect which is also called as a "spin dependent bulk scattering effect", originated from the extremely thin Cu layers.

The spin dependent bulk scattering effect is utilized in pairs for the spin dependent interface scattering effect. The spin dependent bulk scattering effect means the occurrence of an MR effect in a magnetic layer and the spin dependent interface scattering effect means the occurrence of an MR effect at an interface between a spacer layer and a magnetic layer.

Hereinafter, the enhancement of the bulk scattering effect of the stacking structure of the magnetic layer and the non magnetic layer will be described. With the CCP-CPP element, since a current is confined in the vicinity of the spacer layer 16, the resistance in the vicinity of the spacer layer 16 contributes the total resistance of the magneto-resistance effect element. Namely, the resistance at the interface between the spacer layer 16 and the magnetic layers (pinned layer 14 and the free layer 18) contributes largely to the magneto-resistance effect element. That means the contribution of the spin dependent interface scattering effect becomes large and important in the CCP-CPP element. The selection of magnetic material located at the interface for the CCP-NOL layer 16 is important in comparison with a conventional CPP element. In this point of view, the pinned layer 143 is made of the FeCo alloy with the bcc-structure exhibiting the large spin dependent interface scattering effect as described above.

However, it may be that the spin dependent bulk scattering effect should be considered so as to develop the MR variation ratio. In view of the development of the spin dependent bulk scattering effect, the thickness of the thin Cu layer is set preferably within 0.1 to 1 nm, more preferably within 0.2 to 0.5 nm. Too thin Cu layer can not develop the spin dependent bulk scattering effect sufficiently. Too thick Cu layer may reduce the spin dependent bulk scattering effect and weaken the magnetic coupling between the magnetic layers via the non magnetic Cu layer, which the magnetic layers sandwiches the non magnetic Cu layer, thereby deteriorating the property of the pinned layer 14. In a preferred embodiment, in this point of view, the thickness of the non-magnetic Cu layer is set to 0.25 nm.

The non-magnetic layer sandwiched by the magnetic layers may be made of Hf, Zr, Ti instead of Cu. In the case that the pinned layer 14 contains the non-magnetic layer(s), the thickness of the one magnetic layer such as a FeCo layer which is separated by the non-magnetic layer is set preferably within 0.5 to 2 nm, more preferably within 1 to 1.5 nm.

In the above embodiment, the top pinned layer 143 is constituted of the alternately stacking structure of FeCo layer and Cu layer, but may be made of an alloyed layer of FeCo and Cu. The composition of the resultant FeCoCu alloy may be set to $((Fe_XCo_{100-X})_{100-Y}Cu_Y: X=30$ to $100\%, Y=3$ to $15\%)$, but set to another composition range. The third element to be added to the main composition of FeCo may be selected from Hf, Zr, Ti instead of Cu.

The top pinned layer 143 may be also made of a single element such as Co, Fe, Ni or an alloy thereof. In a simplified embodiment, the top pinned layer 143 may be made of an $Fe_{90}Co_{10}$ layer with a thickness of 2 to 4 nm, as occasion demands, containing a third additive element.

Then, the spacer layer will be concretely described. The bottom metallic layer 15 is employed for the formation of the current confining path 162 and thus, functions as a supplier for the current confining path 162. It is not required that the metallic layer 15 remains as it is apparently after the formation of the current confining path 162. In this point of view, the bottom metallic layer 15 functions broadly as a part of the spacer layer. The bottom metallic layer 15 functions as a stopper layer preventing the oxidization of the magnetic layer 143 which is located below the CCP-NOL layer 16 in the formation of the CCP-NOL layer 16.

The extreme thin oxide layer 16 includes the insulating layer 161 and the current confining path 162. The insulating layer 161 is made of oxide, nitride, oxynitride or the like. For example, the insulating layer 161 may be made of an $Al_2O_3$ amorphous structure or an MgO crystalline structure. In order to exhibit the inherent function of the spacer layer, the thickness of the insulating layer 161 is set preferably within 1 to 3 nm, more preferably within 1.5 to 2.5 nm. The insulating layer 161 and the current confining path 162 constitute the non-magnetic metallic path.

The insulating layer 161 may be made of a typical insulating material such as $Al_2O_3$-based material, as occasion demands, containing a third additive element such as Ti, Hf, Mg, Zr, V, Mo, Si, Cr, Nb, Ta, W, B, C, V. The content of the additive element may be appropriately controlled within 0 to 50%. In a preferred embodiment, the insulating layer 161 is made of an $Al_2O_3$ layer with a thickness of about 2 nm.

The insulating layer 161 may be made of Ti oxide, Hf oxide, Mg oxide, Zr oxide, Cr oxide, Ta oxide, Nb oxide, Mo oxide, Si oxide or V oxide instead of the Al oxide such as the $Al_2O_3$. In the use of another oxide except the Al oxide, a third additive element such as Ti, Hf, Mg, Zr, V, Mo, Si, Cr, Nb, Ta, W, B, C, V may be added to the oxide as occasion demands. The content of the additive element may be appropriately controlled within 0 to 50%.

The insulating layer 161 may be also made of a nitride or an oxynitride containing, as a base material, Al, Si, Hf, Ti, Mg, Zr, V, Mo, Nb, Ta, W, B, C only if the insulating layer 161 can exhibit the inherent insulating function.

The current confining path 162 functions as a path to flow a current in the direction perpendicular to the film surface of the spacer layer 16 and then, confining the current. The current confining path 162 also functions as a conductor to flow the current in the direction perpendicular to the film surface of the insulating layer 161 and is made of a metal such as Cu. In other words, the spacer layer 16 exhibits the current-confined path structure (CCP structure) so as to enhance the MR variation ratio from the current confining effect.

The current confining path 162 (CCP) may be made of Au, Ag, Ni, Co, Fe or an alloy containing at least one from the listed elements instead of Cu. In a preferred embodiment, the current confining path 162 is made of a Cu alloy. The current confining path 162 may be made of an alloy layer of CuNi, CuCo or CuFe. Herein, the content of Cu in the alloy is set preferably to 50% or over in view of the enhancement of the MR variation ratio and the reduction of the interlayer coupling field, Hin between the pinned layer 14 and the free layer 18.

The content in oxygen and nitrogen of the current confining path 162 is much smaller than (at least half as large as) the one of the insulating layer 161. The current confining path 162 is generally crystallized. Since the resistance of the crystalline phase is smaller than the resistance of the non-crystalline phase, the current confining path 162 can easily conduct the inherent function.

The top metallic layer 17 functions as a barrier layer protecting the oxidization of the free layer 18 to be formed thereon through the contact with the oxide of the CCP-NOL layer 16 so that the crystal quality of the free layer 18 cannot be deteriorated. For example, when the insulating layer 161 is made of an amorphous material (e.g., $Al_2O_3$), the crystal quality of a metallic layer to be formed on the layer 161 may be deteriorated, but when a layer (e.g., Cu layer) to develop the crystal quality of fcc-structure is provided (under the condition that the thickness of the metallic layer is set to 1 nm or below), the crystal quality of the free layer 18 can be remarkably improved.

It is not always required to provide the top metallic layer 17 dependent on the kind of material in the extreme thin oxide layer 16 and/or the free layer 18. Moreover, if the annealing condition is optimized and the appropriate selection of the materials of the insulating layer 161 of the thin oxide layer 16 and the free layer 18 is performed, the deterioration of the crystal quality of the free layer 18 can be prevented, thereby omitting the metallic layer 17 of the CCP-NOL layer 16.

In view of the manufacturing yield of the magneto-resistance effect element, it is desired to form the top metallic layer 17 on the extreme thin oxide layer 16. In a preferred embodiment, the top metallic layer 17 can be made of a Cu layer with a thickness of 0.5 nm.

The top metallic layer 17 may be made of Au or Ag instead of Cu. Moreover, it is desired that the top metallic layer 17 is made of the same material as the material of the current confining layer 162 of the spacer layer 16. If the top metallic layer 17 is made of a material different from the material of the current confining path 162, the interface resistance between the layer 17 and the path 162 is increased, but if the top metallic layer 17 is made of the same material as the material of the current confining path 162, the interface resistance between the layer 17 and the path 162 is not increased.

The thickness of the top metallic layer 17 is set preferably within 0 to 1 nm, more preferably within 0.1 to 0.5 nm. Too thick top metallic layer 17 may extend the current confined through the spacer layer 16 thereat, resulting in the decrease of the MR variation ratio due to the insufficient current confinement.

The essential point in this embodiment is directed at the remarkable improvement in reliability of the element by forming an adhesive enhancing portion in at least a portion of the spacer layer. The reliability of the element is originated from the difference in crystallinity between the extreme thin oxide layer and the bottom metallic layer, the top metallic layer which are located above or below the thin oxide layer. Details for the adhesive enhancing portion will be described hereinafter.

The free layer 18 is a ferromagnetic layer of which the direction of magnetization is varied commensurate with the external magnetic field. For example, the free layer 18 is made of a double-layered structure of $Co_{90}Fe_{10}$ 1 nm/$Ni_{83}Fe_{17}$ 3.5 nm. In this case, the $Co_{90}Fe_{10}$ layer is formed at the interface between the free layer 18 and the spacer layer 16, which is desirable in the case that the $Ni_{83}Fe_{17}$ layer is formed at the interface therebetween. In order to realize the large MR variation ratio, the selection of magnetic material of the free layer 18 in the vicinity of the spacer 16, that is, at the interface therebetween is important. The free layer 18 may be made of a single $Co_{90}Fe_{10}$ layer with a thickness of 4 nm without a NiFe layer or a triple-layered structure of CoFe/NiFe/CoFe.

Among CoFe alloys, the $Co_{90}Fe_{10}$ layer is preferably employed in view of the stable soft magnetic property. If a CoFe alloy similar to the $Co_{90}Fe_{10}$ alloy in composition is employed, it is desired that the thickness of the resultant CoFe alloy layer is set within 0.5 to 4 nm. Moreover, the free layer 18 may be made of $Co_XFe_{100-X}$ (X=70 to 90%).

Then, the free layer 18 is made of an alternately stacking structure of CoFe layers or Fe layers with a thickness of 1 to 2 nm and extremely thin Cu layers with a thickness of 0.1 to 0.8 nm.

In the case that the spacer layer 16 is made of the Cu layer, it is desired that the FeCo layer with bcc-structure is employed as the interface material thereof for the spacer layer 16 so as to enhance the MR variation ratio in the same manner as the pinned layer 14. As the FeCo layer with bcc-structure, the $Fe_XCo_{100-X}$ (X=30 to 100) or, as occasion demands, containing a third additive element, may be employed. In a preferred embodiment, a $Co_{90}Fe_{10}$ 1 nm/$Ni_{83}Fe_{17}$ 3.5 nm may be employed.

The cap layer 19 functions as protecting the spin valve film. The cap layer 19 may be made of a plurality of metallic layers, e.g., a double-layered structure of Cu 1 nm/Ru 10 nm. The layered turn of the Cu layer and the Ru layer may be switched so that the Ru layer is located in the side of the free layer 18. In this case, the thickness of the Ru layer is set within 0.5 to 2 nm. The exemplified structure is particularly desired for the free layer 19 of NiFe because the magnetostriction of the interface mixing layer formed between the free layer 18 and the cap layer 19 can be lowered due to the non-solution between Ru and Ni.

When the cap layer 19 is made of the Cu/Ru structure or the Ru/Cu structure, the thickness of the Cu layer is set within 0.5 to 10 nm and the thickness of the Ru layer is set smaller, e.g., within 0.5 to 5 nm due to the large specific resistance.

The cap layer 19 may be made of another metallic layer instead of the Cu layer and/or the Ru layer. The structure of the cap layer 19 is not limited only if the cap layer 19 can protect the spin valve film. If the protective function of the cap layer 19 can be exhibited, the cap layer 19 may be made of still another metal. Attention should be paid to the cap layer because the kind of material of the cap layer may change the MR variation ratio and the long reliability. In view of the stable MR variation ratio and long reliability, the Cu layer and/or the Ru layer is preferable for the cap layer.

The top electrode 20 functions as flowing a current through the spin valve film in the direction perpendicular to the film surface of the spin valve film. The intended current can be flowed through the spin valve film in the direction perpendicular to the film surface by applying a voltage between the top electrode 20 and the bottom electrode 11. The top electrode 20 may be made of a material with smaller resistance (e.g., Cu or Au).

In this embodiment, the spacer layer 16 is disposed between the pinned layer 14 and the free layer 18 so that the bottom non-magnetic metallic layer 15, the extreme thin oxide layer 16 (made of the insulating portions and metal paths), the top non-magnetic layer and the free layer are subsequently formed on the pinned layer 14.

Figure 2:
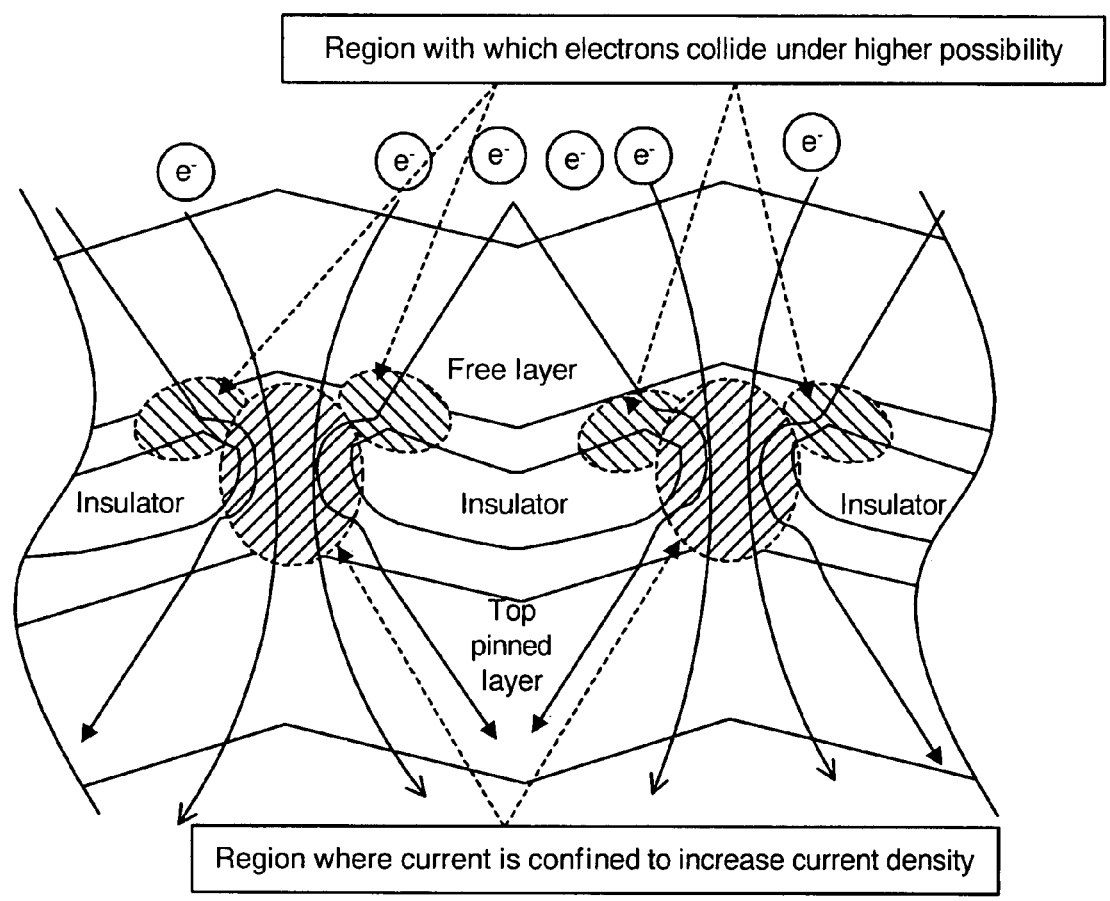
FIG. 2 is a schematic view illustrating the area in the vicinity of the spacer layer of the magneto-resistance effect element in FIG. 1.

As shown in FIG. 2, a current is confined so that the conduction electrons are concentrated at the metal paths. In this case, since the current density is increased in the vicinity of the metal paths, Joule heat is also generated and increased. Then, Electron migration may occur originated from the collision between the electrons. In this way, the structure of the spacer layer contributes largely to the reliability of the element when the current is flowed in the element.

Since the crystallinity of the extremely thin oxide layer is different from the crystallinity of another layer, the adhesion between the thin oxide layer and another layer is lowered. Then, since the crystallinities of the bottom metallic layer 15 and the top metallic layer 17 are shifted from the inherent crystallinities due to the thin oxide layer, and thus, different from the crystallinities of the pinned layer 14 and the free layer 18, the adhesion between the bottom metallic layer 15 and the pinned layer 14 and the adhesion between the top metallic layer 17 and the free layer may be lowered. Under the circumstance, if Joule heat is generated and electron attack is brought about from the current flow, some voids may be formed at the interfaces between the layers composing the spacer layer and the scattering of conduction electron, which normally occurs prior to the formation of void, may occur.

In this point of view, in this embodiment, SAT (Strengthen Adhesion Treatment) is carried out for a portion (or all) of the spacer layer. The SAT means roughing the interface between the insulating layer 161 and another metallic layer so as to enhance the adhesion therebetween through the increase of the contacting area therebetween. The SAT also means the intermixing of element of the insulating layer and another metallic layer.

Details for the SAT will be described hereinafter, but in the SAT, ion treatment of plasma treatment will be carried out during the formation of the spacer.

A. Adhesion of the Spacer Layer

FIG. 2 is a conceptual view of the conduction in a current confining type CCP-CPP spin valve film. The current is concentrated in the vicinity of the metal paths so that the current density is increased in the vicinity of the metal paths and the Joule heat is generated in the same region. Therefore, the temperature in the vicinity of the metal paths becomes high locally in the CCP-CPP spin valve film. Then, the conduction electrons attack the insulating layer in the vicinity of the metal paths and thus, damages the same region. The CCP-CPP spin valve film is under severe condition due to the current concentration, in comparison with the TMR (Tunneling Magneto Resistance) film.

Normally, the crystallinity of the insulating layer is different from the crystallinity of the metallic layer so that the adhesion between the insulating layer and the metallic layer is poor. Although elemental dimension is different, in a Si device, the adhesion between the electrode and the insulating material is poor so as to bring about the peeling-off.

In the current confining type spin valve film containing the NOL structure, the metal path 162, the bottom metallic layer 15 and the top metallic layer 17 become amorphous-like structure or micro-crystalline structure, not complete crystalline structure, in addition to the insulating layer 161. In this point of view, the bottom metallic layer 15 and the top metallic layer 17 can not be matched sufficiently with the pinned layer 14 and the free layer 18 which have the respective almost crystalline structures.

Figure 3:
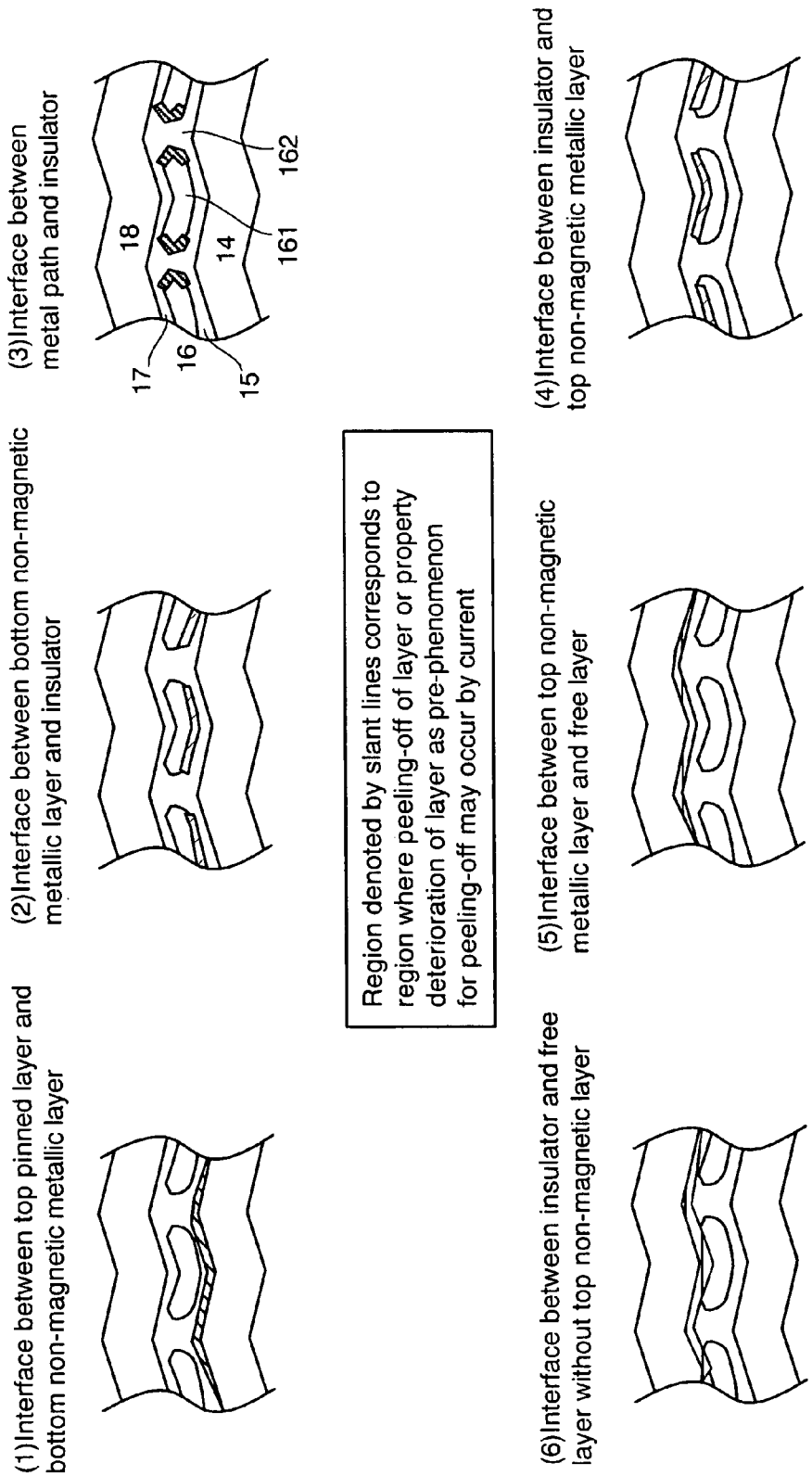
FIG. 3 is a conceptual view representing a breaking mode in the vicinity of the spacer layer of the magneto-resistance effect element in FIG. 1.

FIG. 3 shows some breaking modes of the spacer layer due to the reduction of adhesion. (1) relates to the interface between the pinned layer 14 and the bottom metallic layer 15, (2) relates to the interface between the bottom metallic layer 15 and the insulating layer 161, (3) relates to the interface between the insulating layer 161 and the metal paths 162, (4) relates to the interface between the insulating layer 161 and the top metallic layer 17, and (5) relates to the interface between the top metallic layer 17 and the free layer 18. When the spacer layer is observed after the current flow, the interface in the spacer layer is not broken, so it is considered that the microscopic disorder of atom affects the spin dependent conduction. If the adhesion at the interface is enhanced, it is expected that the performance of the spin valve film can be enhanced remarkably.

B. Enhancement of the Reliability of the Magneto-Resistance Effect Element by the Enhancement of the Adhesion In this embodiment, the SAT is carried out by means of plasma treatment or ion beam treatment. Namely, the ion beam treatment or the plasma treatment is carried out for the interface which may be subject to the breaking mode as shown in FIG. 3 so as to rough the interface and thus, increase the contacting area via the interface. In this case, the adhesion via the interface can be enhanced. In some cases, the ion beam treatment and the plasma treatment cause intermixing at the interface so as to enhance the adhesion via the interface.

<Method of the Magneto-Resistance Effect Element>

Figure 4:
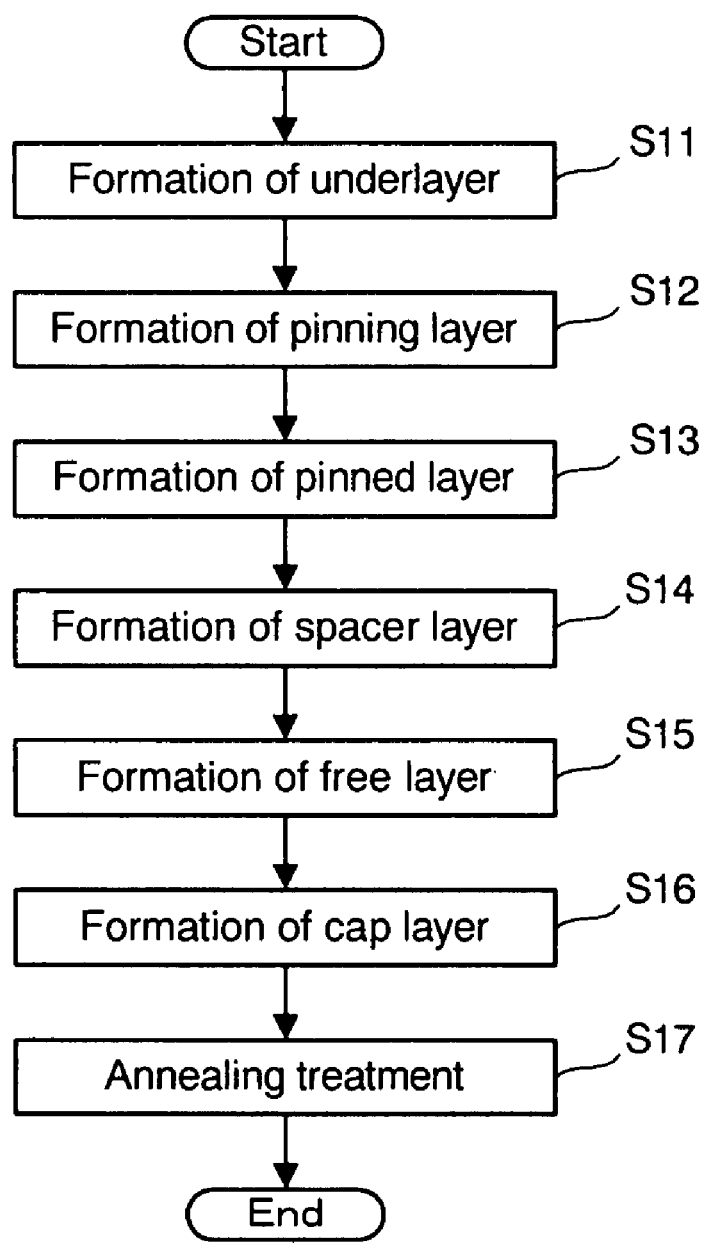
FIG. 4 is a flowchart showing a manufacturing process of the magneto-resistance effect element in FIG. 1.

Hereinafter, a method for manufacturing the magneto-resistance effect element in this embodiment will be described. FIG. 4 is a flowchart relating to the manufacturing process of the magneto-resistance effect element in this embodiment. As shown in FIG. 4, the underlayer 12 through the cap layer 19 are subsequently formed (Step S11 to S17). The SAT is carried out for a portion or all of the spacer layer during the formation of the free layer 18.

A. Strengthen Adhesion Treatment (SAT)

The SAT is carried out for controlling the remaining stress in the free layer 18. The SAT will be described in detail, hereinafter.

Figure 5:
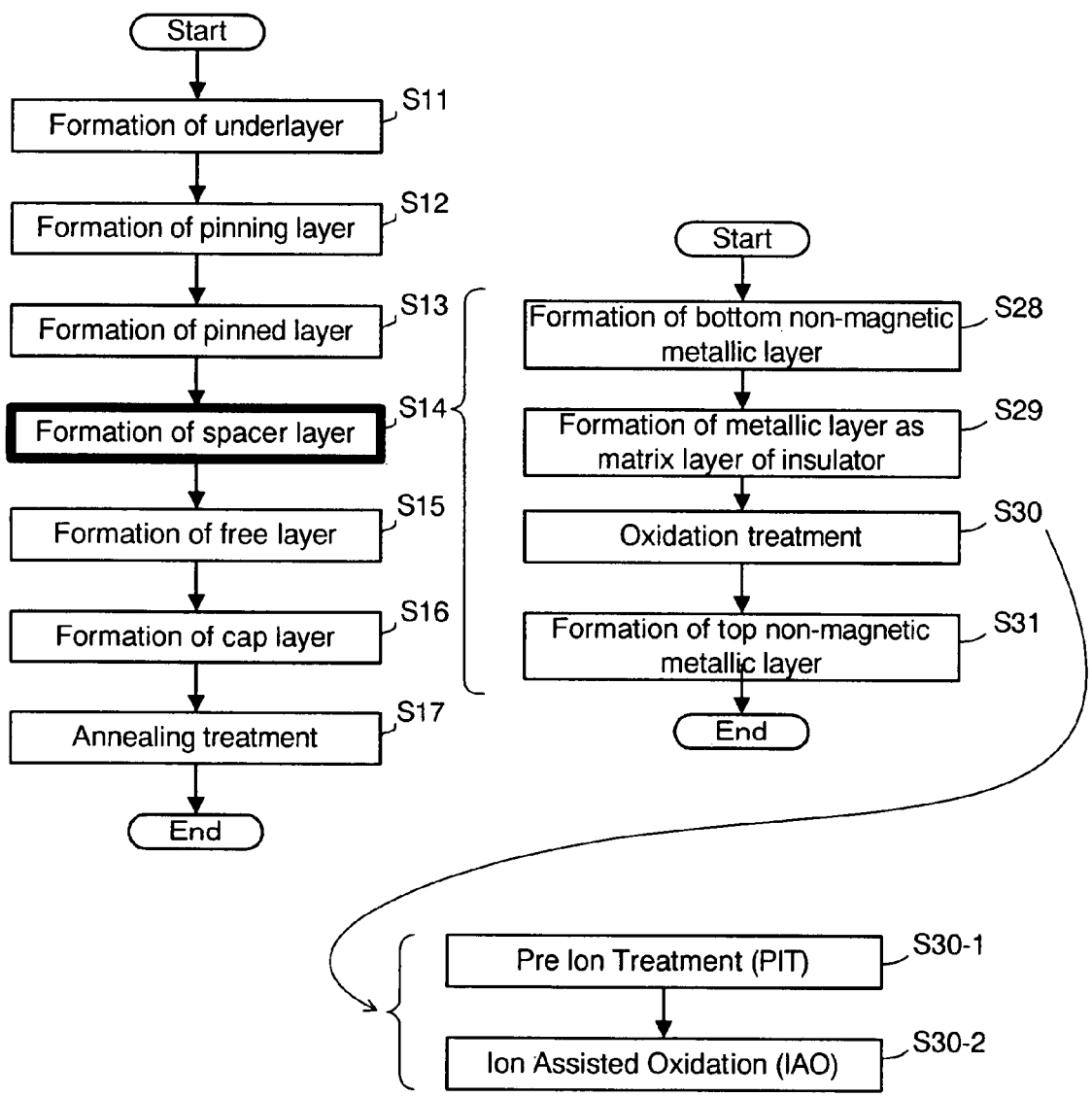
FIG. 5 is a flowchart showing a concrete forming process of the magneto-resistance effect element in FIG. 1.

FIG. 5 is a flowchart concretely showing the Step S14 in FIG. 4 without the SAT.

The SAT can be carried out in any step of the forming process of the spacer layer because the adhesion between any two layers composing the spacer layer is low and thus, may be improved by the SAT.

Figure 9:
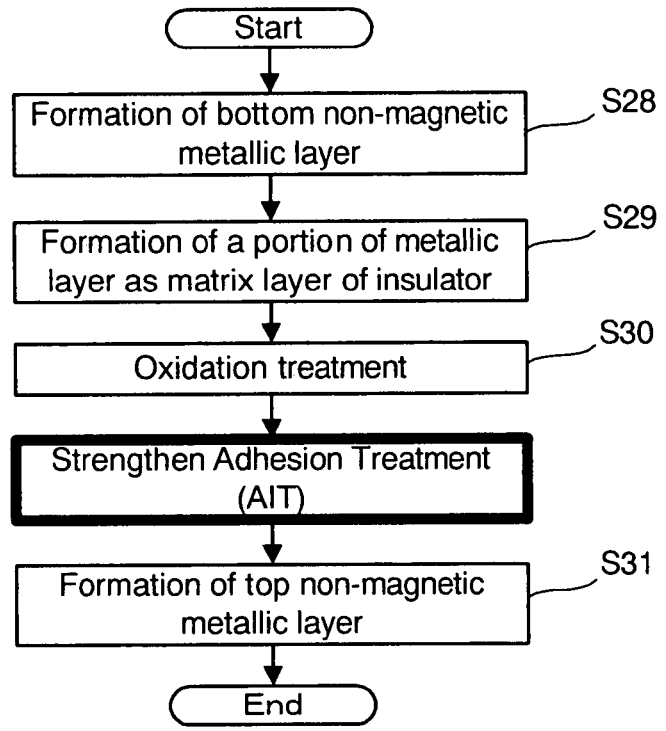
FIG. 9 is a further flowchart showing a concrete forming process of the magneto-resistance effect element in FIG. 1 containing an adhesion enhancing treatment.
Figure 9:
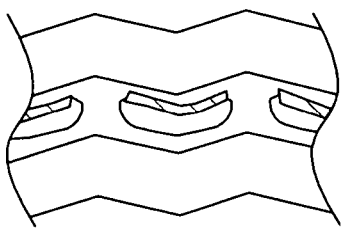
Figure 10:
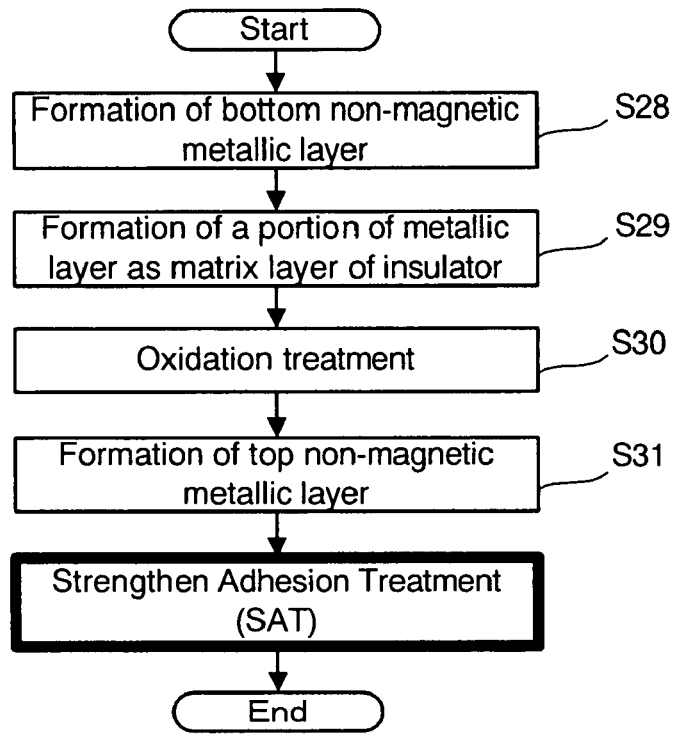
FIG. 10 is another flowchart showing a concrete forming process of the magneto-resistance effect element in FIG. 1 containing an adhesion enhancing treatment.
Figure 10:
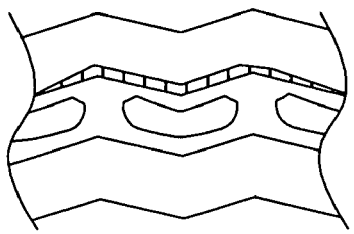
Figure 11:
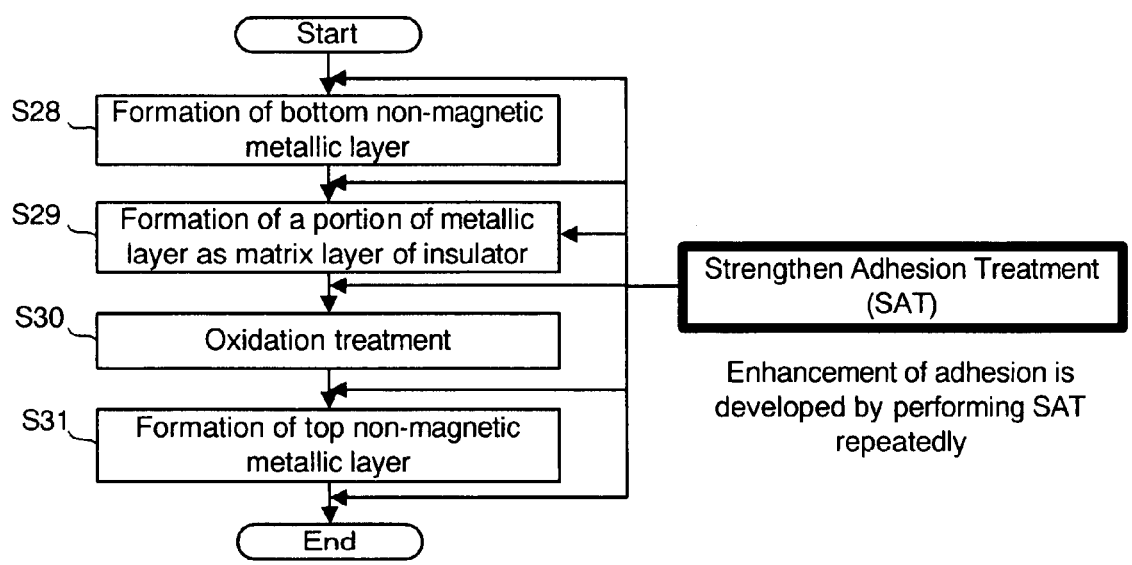
FIG. 11 is still another flowchart showing a concrete forming process of the magneto-resistance effect element in FIG. 1 containing an adhesion enhancing treatment.

The manufacturing process containing the SAT in the forming process of the spacer layer is exemplified referring to FIGS. 6 to 11. As shown in FIG. 11, the SAT can be carried out in two or over steps of the forming process of the spacer layer.

In the case that the SAT is carried out by means of Ar ion beam irradiation and Ar plasma irradiation, the Ar ions are incorporated into the free layer 18. In this case, since the Ar ions are incorporated in the spacer layer, the content of Ar may be increased than another layer. Concretely, the spacer layer contains the Ar ions as twice as the Ar ions of another layer. The state where Ar ions are incorporated can be observed by means of composition analysis using a cross-section transmission electron microprobe, depth profile using a SIMS (Secondary Ion Mass Spectrum) or three-dimensional atom probe microscope. In the depth profile, the film composition is analyzed by milling the film from the surface thereof.

In the case that the ion beams or the plasma of another gas is employed, the gas element may be incorporated.

B. Detail of the SAT Using the Ion Beam Treatment of the Plasma Treatment

As described previously, the ion beam treatment or the plasma treatment is carried out during or after the formation of the free layer 18. Hereinafter, the ion beam treatment will be described in term (1) and the plasma treatment will be described in term (2).

In the SAT, the ion beams or the plasma of inert gas is irradiated. As the inert gas, Ar, Xe, Kr, He, Ne are exemplified. In view of the productivity cost, Ar is desirable. As occasion demands, Xe may be employed so as to exhibit the specific effect.

(1) Ion Beam Treatment

The ion beam treatment means irradiating ion beams onto a sample to be processed by means of ion gun or the like. A predetermined gas is ionized in the ion gun by means of ICP (inductive charge coupled) plasma and accelerated by a prescribed accelerating voltage, thereby emitting the intended ion beams from the ion gun. The amount of plasma is controlled by the RF power so that the irradiating amount of ion onto the sample is controlled in accordance with the beam current and the energy of the ion beam treatment is controlled by the accelerating voltage.

In the SAT, for example, the ion beams are irradiated under the condition that the accelerating voltage is set within 30 to 150 V, the beam current Ib is set within 20 to 200 mA and the RF power is set within 10 to 300 W. The RF power is an electric power to generate the plasma by the ion source. The condition of the SAT is mitigated in comparison with the condition of a normal ion beam etching because too severe condition of the SAT may etch the free layer 18 (e.g., made of CoFe or NiFe) and thus, diminish the free layer 18.

If the CCP-CPP element is manufactured in view of the thickness to be etched as described in terms (a) and (b) hereinafter, the SAT can be carried out under more severe condition.

(a) The thickness of the second metallic layer is set thicker by 2 nm or over than designed in view of the thickness thereof to be etched.

(b) The ion beam treatment is carried out under more severe condition than the condition in term (a) so that the thickness of the remaining second metallic layer is set as designed.

In the SAT, the thickness of the second metallic layer is decreased typically by a range of 0 to 0.5 nm, which is very small thickness reduction in comparison with a normal etching process for manufacturing a device. The small thickness reduction range of 0 to 0.5 nm of the magnetic layer by the SAT can be compensated appropriately by, e.g., forming the additional magnetic layer of which the thickness corresponds to the thickness reduction of the magnetic layer due to the SAT or forming the magnetic layer thicker than the designed thickness by a range of 0 to 0.5 nm before the SAT.

Suppose that the incident angle of the ion beams is set zero when the ion beams are incident onto a layer in the direction perpendicular to the film surface thereof and that the incident angle of the ion beams is set to 90 degrees when the ion beams are incident onto a layer in the direction parallel to the film surface, the incident angle of the ion beams may be set preferably within a range of 0 to 80 degrees. The treatment period is set preferably within 15 to 300 seconds, particularly within 30 seconds or over in view of the controllability of the irradiation of the ion beams. Too long treatment period may deteriorate the productivity yield of the magneto-resistance effect element (CCP-CPP element). Therefore, the treatment period is set more preferably within 30 too 180 seconds.

(2) Plasma Treatment

The plasma treatment means irradiating a plasma onto a sample to be processed by means of plasma gun or the like. A predetermined gas such as Ar, Xe, Kr is rendered plasma by means of RF power and irradiated onto the sample. The current and the energy can be controlled by the RF power. The intensity of the RF plasma treatment is determined by the RF power. The accelerating voltage and the beam current are automatically determined by the RF power so that the current and the energy can not be controlled independently different from the case of the ion beam treatment.

In the plasma treatment, the energy range and the treatment period can be determined in the same manner as the ion beam treatment. For example, it is desired that the accelerating voltage is set within 30 to 150 V, the beam current Ib is set within 20 to 200 mA and the RF power (the plasma is excited by means of the ion source so as to maintain the beam current constant) is set within 10 to 300 W. In order to perform the SAT under the condition that the layer under the SAT is not etched, it is desired that the RF power is set within a range of 10 to 100 W, preferably within a weak power range of 10 to 50 W in view of the controllability thereof.

The treatment period is set preferably within 15 to 300 seconds, particularly within 30 seconds or over in view of the controllability of the irradiation of the plasma. Too long treatment period may deteriorate the productivity yield of the magneto-resistance effect element (CCP-CPP element). Therefore, the treatment period is set more preferably within 30 to 180 seconds in the same manner as the ion beam treatment.

As described below, the ion beam treatment and the plasma treatment can have the respective advantages and disadvantages so that the ion beam treatment and the plasma treatment can be appropriately employed depending on the situation. Namely, the RF plasma treatment can exhibit excellent maintenance performance and is suitable for mass-production. On the other hand, the RF plasma treatment can not exhibit the excellent controllability in comparison with the ion beam treatment because in the plasma treatment, the accelerating voltage, the RF power and the current can not be controlled independently. If one selected from the accelerating voltage, the RF power and the current is determined, the others are automatically determined.

Figure 13:
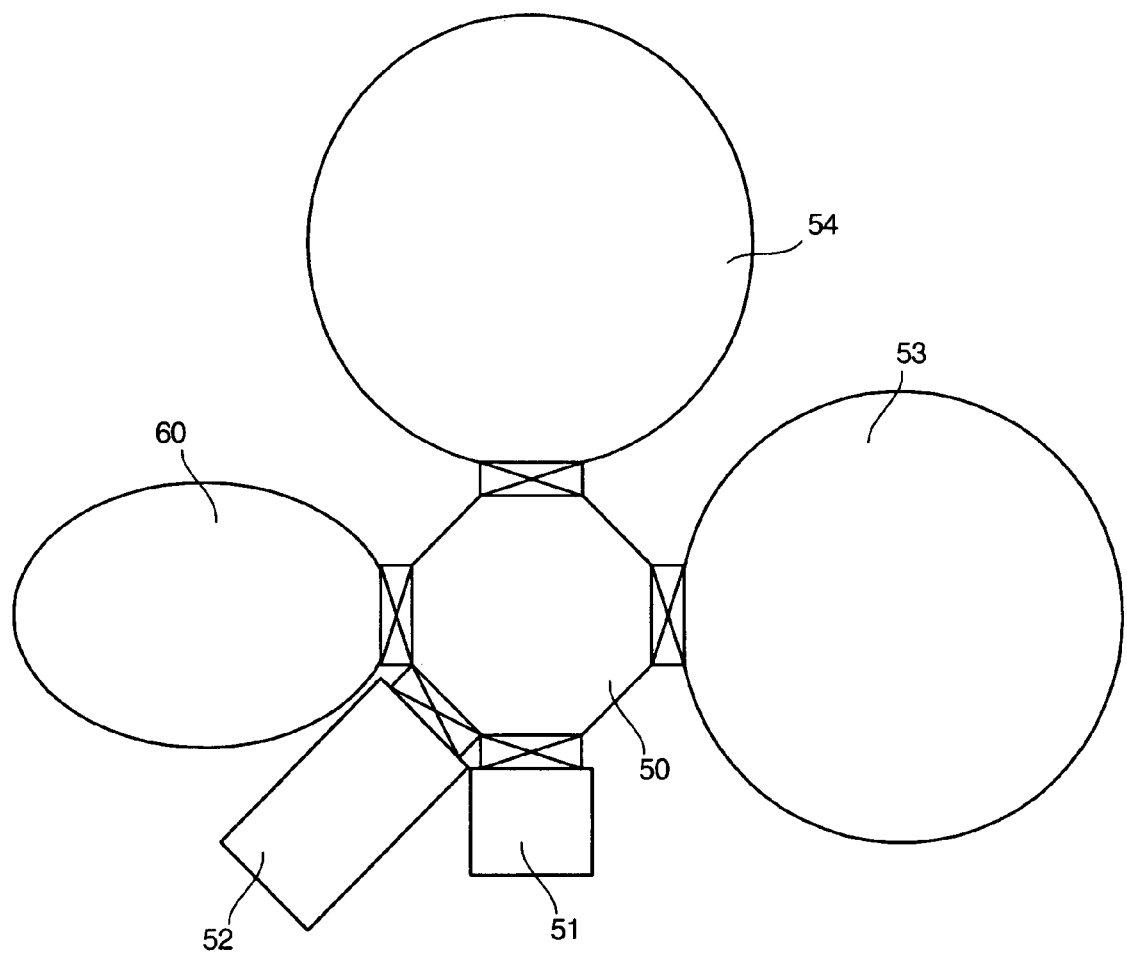
FIG. 13 is a schematic view illustrating a film forming apparatus for manufacturing a magneto-resistance effect element by using the present invention.

C. Apparatus to be Employed for Manufacturing a Magneto-Resistance Effect Element FIG. 13 is a schematic view illustrating a film forming apparatus for manufacturing a magneto-resistance effect element by using the present invention. As shown in FIG. 13, the transfer chamber (TC) 50 is disposed at the center of the apparatus such that the load lock chamber 51, the pre-cleaning chamber 52, the first metallic film-forming chamber (MC1) 53, the second metallic film-forming chamber (MC2) 54 and the oxide layer-nitride layer forming chamber (OC) 60 are disposed so as to be connected with the transfer chamber 50 via the gate valves, respectively. In the apparatus, the substrate on which various films are to be formed is transferred from one chamber from another chamber under the vacuum condition via the corresponding gate valve. Therefore, the surface of the substrate can be maintained clean.

The metallic film-forming chambers 53 and 54 include a plurality of targets (five to ten targets) which is called as a multi-structured target. As the film forming means, a sputtering method such as a DC magnetron sputtering or an RF magnetron sputtering, an ion beam sputtering, a vacuum deposition, a CVD (Chemical Vapor Deposition) or an MBE (Molecular Beam Epitaxy) can be employed.

The SAT can be performed in a chamber with an RF plasma mechanism, an ion beam mechanism or a heating mechanism. Concretely, the SAT can be preferably performed in the metallic film forming chambers 53 and 54 with an RF biasing mechanism and/or in the pre-cleaning chamber 52. Since the RF plasma mechanism has a simplified mechanism, the RF plasma mechanism can be easily installed in the metallic film-forming chambers 53 and 54. By using the metallic film-forming chambers 53 and 54, the metallic film formation and the SAT can be performed simultaneously.

Herein, it is not desired that the SAT is performed in the oxide layer-nitride layer forming chamber (OC) 60. In this case, the oxygen gas absorbed onto the inner wall of the chamber is released to contaminate the free layer 18 so that the free layer 18 may be deteriorated. In the metallic film-forming chamber, since the oxygen gas is not absorbed onto the inner wall of the chamber because the oxygen gas is not used at the film-forming process, the vacuum condition of the chamber can be easily maintained.

The typical pressure in the above-described vacuum chamber is in the order of $10^{-9}$ Torr, and the allowable pressure range is the order of $5 \times 10^{-8}$ Torr or below.

D. Schematic Explanation of the Method for Manufacturing a Magneto-Resistance Effect Element Hereinafter, the method for manufacturing a magneto-resistance effect element will be schematically described. First of all, on the substrate (not shown) are subsequently formed the bottom electrode 11, the underlayer 12, the pinning layer 13, the pinned layer 14, the bottom metallic layer 15, the spacer layer 16, the top metallic layer 17, the free layer 18, the cap layer 19 and the top electrode 20.

A substrate is set into the load lock chamber 51 so that some metallic films are formed in the metallic film-forming chambers 53 and 54 and some oxide and/or nitride layers are formed in the oxide layer-nitride layer forming chamber 60. The ultimate vacuum of the metallic film-forming chambers 53 and 54 is preferably set to $1 \times 10^{-8}$ Torr or below, normally within a range of $5 \times 10^{-10}$ Torr-$5 \times 10^{-9}$ Torr. The ultimate vacuum of the transfer chamber 50 is set in the order of $10^{-9}$ Torr. The ultimate vacuum of the oxide layer-nitride layer forming chamber 60 is set to $8 \times 10^{-8}$ Torr or below.

(1) Formation of Underlayer 12 (Step S11)

The bottom electrode 11 is formed on the (not shown) substrate by means of micro-process in advance. Then, the underlayer 12 is formed as a layer of Ta 5 nm/Ru 2 nm on the bottom electrode 11. The Ta layer functions as the buffer layer 12a for relaxing the surface roughness of the bottom electrode 11. The Ru layer functions as the seed layer 12b for controlling the crystalline orientation and the crystal grain of the spin valve film to be formed thereon.

(2) Formation of pinning layer 13 (Step S12)

Then, the pinning layer 13 is formed on the underlayer 12. The pinning layer 13 may be made of an antiferromagnetic material such as PtMn, PdPtMn, IrMn, RuRhMn.

(3) Formation of Pinned Layer 14 (Step S13)

Then, the pinned layer 14 is formed on the pinning layer 13. The pinned layer 14 may be formed as the synthetic pinned layer of the bottom pinned layer 141 ($Co_{90}Fe_{10}$)/the magnetic coupling layer 142 (Ru)/the top pinned layer 143 ($Co_{90}Fe_{10}$). In the case that the pinning layer 13 is made of IrMn, the pinning effect of the pinning layer 13 can be enhanced and then, the magnetic stability can be enhanced when the bottom pinned layer is made of $Fe_{75}Co_{25}$. If the top pinned layer is structured as $Fe_{50}Co_{50}$ 1 nm/Cu 0.25 nm/$Fe_{50}Co_{50}$ 1 nm/Cu 0.25 nm/$Fe_{50}Co_{50}$ 1 nm by inserting the thin Cu layers into the $Fe_{50}Co_{50}$ layer, the spin dependent scattering effect can be increased so as to enhance the large MR variation.

(4) Formation of Spacer Layer 16 (Step S14)

Then, the spacer layer 16 with the current-confined-path structure (CCP structure) is formed in the oxide layer-nitride layer forming chamber 60.

The spacer layer 16 can be formed by using the formation process as shown in FIG. 5. In this embodiment, the spacer layer 16 is configured such that the current confining path 162 made of crystalline Cu is formed in the insulating layer 161 made of amorphous $Al_2O_3$.

1) Formation of Bottom Metallic Layer (Step S28)

First of all, the bottom metallic layer 15 (first metallic layer; e.g., made of Cu) as a supplier for the current confining path is formed on the top pinned layer 143. The thickness of the bottom metallic layer 15 is adjusted in accordance with the thickness of the metallic layer (e.g., AlCu layer) as a matrix layer of the insulating layer. If the AlCu layer is formed thicker, the Cu layer must be also formed thicker because much amount of Cu must be infiltrated into the AlCu layer at the PIT process as described later in term 3). For example, when the thickness of the AlCu layer is set within 0.6 to 0.8 nm, the thickness of the Cu layer is set within 0.3 to 1 nm. Since too thin Cu layer can not supply the Cu elements sufficiently into the AlCu layer, it becomes difficult the current confining path 162 can be formed so as to penetrate through the insulating layer 161. Particularly, the Cu elements can not be supplied sufficiently to the top of the insulating layer 161. As a result, the surface resistance RA may be too increased so that the large MR variation degree can not be obtained.

In contrast, too thick Cu layer may cause the remnant Cu layer between pinned layer 14 and the spacer layer 16. In order to realize the high MR variation ratio in the CPP-CPP element, it is required that the current confined through the spacer layer 16 is flowed to the magnetic layer (the pinned layer 14 or the free layer 18) as it is. If the thick Cu layer remains between the pinned layer 14 and the spacer layer 16, the current confined through the spacer layer 16 is extended in the vicinity of the pinned layer 14, resulting in the deterioration of the MR variation ratio. In this point of view, it is desired that the thickness of the remnant Cu layer is set to 1 nm or below after the completion of the intended magneto-resistance effect element. If the thickness of the Cu layer is set beyond the above-described range, the current confinement effect is diminished and thus, the MR variation ratio may not be enhanced. Preferably, the thickness of the Cu layer is set to 0.6 nm or below.

The first metallic layer (bottom metallic layer 15) constituting the current confining path 162 may be made of another material such as Au or Ag instead of Cu. However, it is desired that the current confining path 162 is made of Cu because the Cu current confining path 162 can exhibit a larger thermal stability against a given thermal treatment in comparison with an Au or Ag current confining path. The current confining path 162 may be made of a magnetic material instead of the non-magnetic material as described above. As the magnetic material, Co, Fe, Ni and an alloy thereof can be exemplified.

If the current confining path 162 is made of the same magnetic material as the pinned layer 14, the metallic supplier (first metallic layer) for the current confining path 162 is not required to be formed on the pinned layer 14. Namely, a second metallic layer to be converted into the insulating layer 161 is formed on the pinned layer 14, and the element composing the pinned layer 14 is infiltrated into the second metallic layer through the PIT process, thereby forming the current confining path 162 made of the magnetic material of the pinned layer 14.

2) Formation of Metallic Layer as a Matrix Layer of Insulating Layer (Step S 29)

A metallic layer (second metallic layer; e.g., made of AlCu or Al) to be converted into the insulating layer 161 is formed on the bottom metallic layer 15.

If the second metallic layer is made of $Al_{90}Cu_{10}$, the elemental Cu of the second metallic layer is segregated from the elemental Al thereof and the elemental Cu of the first metallic layer is pumped up. Namely, the current confining path 162 is formed by the first and second metallic layers. The second metallic layer may be made of only Al without Cu constituting the current confining path 162 instead of the $Al_{90}Cu_{10}$. In this case, the elemental Cu to constitute the current confining path 162 is supplied from the first metallic layer. If the second metallic layer is made of AlCu, the elemental Cu can be supplied to the current confining path 162 from the second metallic layer in the PIT process. Therefore, even though the insulating layer 161 is formed thicker, the current confining path 162 can be easily formed. If the second metallic layer is made of Al, $Al_2O_3$ with large withstand voltage may be formed in the second metallic layer through oxidation. In this case, the elemental Cu is unlikely to be infiltrated in the second metallic layer. In this way, the second metallic layer can exhibit different advantages depending on the kind of material thereof such as AlCu or Al. Therefore, the second metallic layer can be made of AlCu or Al depending on the situation.

When the second metallic layer is made of AlCu, the thickness of the second metallic layer is set within 0.6 to 2 nm. When the second metallic layer is made of Al, the thickness of the second metallic layer is set within 0.5 to 1.7 nm. The thickness of the insulating layer 161 converted through oxidation from the second metallic layer is set within 0.8 to 3.5 nm. Particularly, the insulating layer 161 with a thickness of 1.3 to 2.5 nm can be easily formed and thus, exhibit some advantages for the current confinement effect. The diameter of the current confining path 162 through the insulating layer 161 is within a range of 1 to 10 nm, preferably within a range of 2 to 6 nm. If the diameter of the current confining path 162 is beyond 10 nm, the characteristics of the intended magneto-resistance effect element may fluctuated due to the large size of the current confining path 162 as the magneto-resistance effect element is downsized. In this point of view, it is desired that the current confining path 162 with a diameter of 6 nm or over is not formed.

The AlCu of the second metallic layer can be preferably represented by the composition formula of $Al_xCu_{100-X}$ (X=100 to 70%). The third additive element such as Ti, Hf, Zr, Nb, Mg, Mo or Si may be added to the AlCu of the second metallic layer. The content of the third additive element may be preferably set within 2 to 30%. The third additive element may make the formation of the CPP structure easy. If the rich amount of the third additive element is distributed at the interface between the insulating layer 161 made of $Al_2O_3$ and the current confining path 162 made of Cu, the adhesion between the insulating layer 161 and the current confining path 162 may be increased so as to enhance the electro-migration resistance.

In the CCP-CPP element, the current density in the current confining path 162 of the spacer layer 16 is increased remarkably within a range of $10^7$ to $10^{10}$ A/cm². Therefore, the large electron-migration resistance and the high stability are required for the spacer layer 16 due to the large current density. However, if the ideal CPP structure is formed as designed, the large electron-migration resistance can be realized without the addition of the third additive element.

The second metallic layer may be made of another alloy mainly composed of Hf, Mg, Zr, Ti, Ta, Mo, W, Nb or Si, instead of the Al alloy to form the $Al_2O_3$ insulating layer. The insulating layer 161 may be made of a nitride or an oxynitride instead of an oxide such as $Al_2O_3$.

Irrespective of the kind of material of the second metallic layer, the thickness of the second metallic layer is set preferably within 0.5 to 2 nm so that the thickness of the insulating layer formed through the conversion can be set within 0.8 to 3.5 nm.

The insulating layer 161 may be made of an oxide, a nitride or an oxynitride formed by oxidizing, nitriding or oxynitriding an alloy. For example, the insulating layer 161 may be made of an oxide composed of an $Al_2O_3$ matrix and an additional element such as Ti, Mg, Zr, Ta, Mo, W, Nb or Si added into the $Al_2O_3$ matrix or an oxide composed of Al and other metals by an amount of 0 to 50%.

3) Oxidation Treatment (Step 30)

Then, the second metallic layer is oxidized. In natural oxidation performed by supplying oxygen into the chamber, the amount of oxygen to be exposed for the second metallic layer is set within 5 to 15 kL (1 langumuire=$1\times10^{-5}$ Torr$\times$1 S). In ion beam oxidation or plasma oxidation, the amount of oxygen to be exposed for the second metallic layer is set within 0.1 to 5 kL.

The oxidation treatment can be carried out by two steps.

3-1) Pre Ion Treatment (Step S30-1)

For example, in the first step, ion beams of inert gas such as Ar are irradiated onto the second metallic layer. The irradiation of ion beams corresponds to a pre-treatment, and is called as a "PIT (Pre-ion treatment)". By using the PIT, the elements (e.g., Cu elements) of the first metallic layer (bottom metallic layer 15: Cu layer) is pumped up and infiltrated into the second metallic layer (e.g., AlCu layer) so as to constitute the current confining path 162 after the post-oxidation because the Cu elements can maintain the inherent metallic property. Therefore, it is important that such an energy treatment as the PIT is carried out.

The first metallic layer (bottom metallic layer 15: Cu layer) is formed as a film after the film-forming process. Then, the elemental Cu of the first metallic layer is pumped up and infiltrated into the second metallic layer (AlCu layer) by means of PIT. The elemental Cu maintains the inherent metallic property after the post-oxidation and thus, constitutes the current confining path 162. The PIT treatment is important for realizing the current confining structure (CCP structure) made of high purity Cu.

In the PIT process, for example, the Ar ion beams are irradiated under the condition that the accelerating voltage is set within 30 to 150 V, the beam current is set within 20 to 200 mA and the treatment period of time is set within 30 to 180 seconds. The accelerating voltage is preferably set within 40 to 60 V. If the accelerating voltage is set beyond the above-described range, the PIT process induces the surface roughness for the assembly under fabrication, thereby deteriorating the MR variation ratio. The beam current is preferably set within 30 to 80 mA and the treatment period of time is preferably set within 60 to 150 seconds.

The spacer layer 16 composed of the insulating layer 161 and the current confining path 162 can be formed by means of biasing sputtering, instead of the PIT process. With the DC biasing, the energy of the biasing sputtering is configured such that the DC biasing voltage is set within 30 to 200 V.

With the RF biasing, the energy of the biasing sputtering is configured such that the RF biasing power is set within 30 to 200 W.

3-2) Ion Assisted Oxidation (Step S30-2)

Then, an oxidizing gas (e.g., oxygen gas) is supplied to oxidize the second metallic layer, thereby forming the insulating layer 161. In this case, the oxidizing condition is determined so as not to oxidize the current confining path 162 as it is. By applying the oxidation treatment, the second metallic layer is converted into the insulating layer 161 (e.g., made of $Al_2O_3$) so as to form the spacer layer 16.

For example, an oxidizing gas (e.g., oxygen gas) is supplied to oxidize the second metallic layer while the ion beams of inert gas (Ar, Xe, Kr, He or the like) are irradiated onto the second metallic layer, which is called as an "Ion beam-assisted oxidation: IAO". By using the IAO process, the spacer layer 16 with the insulating layer 161 made of, e.g., $Al_2O_3$ and the current confining path 162 made of, e.g., Cu is formed. Since elemental Al is likely to be oxidized and elemental Cu is unlikely to be oxidized, in the process, the difference in oxide formation energy between the elemental Al and the elemental Cu is utilized.

In the IAO process, for example, the Ar ion beams are irradiated under the condition that the accelerating voltage is set within 40 to 200 V, the beam current is set within 30 to 200 mA and the treatment period of time is set within 15 to 300 seconds while the oxygen gas is supplied. The accelerating voltage is preferably set within 50 to 100 V. If the accelerating voltage is set beyond the above-described range, the IAO process may induce the surface roughness for the assembly under fabrication, thereby deteriorating the MR variation ratio. The beam current is preferably set within 40 to 100 mA and the treatment period of time is preferably set within 30 to 180 seconds.

In the IAO process, the amount of oxygen is set preferably within 2000 to 4000 L (Langmuir) because it is not desired that the bottom magnetic layer (pinned layer 14) is oxidized in addition to the second metallic layer, which leads to the deterioration of the thermal resistance and reliability of the CCP-CPP element. In view of the enhancement of the reliability of the CCP-CPP element, it is important that the magnetic layer (pinned layer 14) under the spacer layer 16 is not oxidized so as to maintain the metallic property thereof. In this point of view, the amount of oxygen to be supplied is preferably set within the above-described range.

In order to form the stable oxide by supplying the oxygen, it is desired that the oxygen is supplied only while the ion beams are irradiated onto the assembly under fabrication. In other words, it is desired that the oxygen is not supplied while the ion beams are not irradiated.

The plasma treatment (irradiation) may be carried out instead of the ion beam treatment (irradiation). In this case, the RF output power to generate the plasma is set within a range of 50 to 300 W and the amount of oxygen is set in the same manner as the ion beam treatment (irradiation) as described above.

4) Formation of Top Metallic Layer (Step S31)

The top metallic layer 17 is formed as a Cu layer with a thickness of 0.25 nm on the extreme thin oxide layer 16. The preferable thickness range of the top metallic layer 17 is within 0.2 to 0.6 nm. The crystallinity of the free layer 18 is enhanced as the thickness of the top metallic layer 17 is increased. Too thick top metallic layer may cause the reduction of the current confining effect and thus, the reduction of the MR variation. In this point of view, it is desired that the thickness of the top metallic layer is set to 0.4 nm in view of the enhancement in crystallinity and MR variation of the free layer 18.

In the case that the crystallinity of the free layer 18 is not directed at or that the crystallinity of the free layer 18 can be enhanced by another means, the top metallic layer may be omitted. In this case, the Step S 31 may be omitted. In the term (4), the forming process for the spacer layer is described referring to the terms 1) to 4).

In the present invention, it is required that the SAT is carried our for the spacer layer. As described previously, the ion treatment, the plasma treatment or the thermal treatment is carried out for the bottom metallic layer, the metallic layer under formation to be to constitute the matrix layer of the insulating layer and/or the top metallic layer.

Concretely, after the bottom metallic layer is formed as a Cu layer of a thickness of 1 nm, the SAT is carried out for the bottom metallic layer by means of RF plasma treatment under the condition that the RF power is set within 10 to 100 W during 60 to 120 seconds. Then, the remnant matrix layer of the insulating layer is formed, e.g., as an AlCu layer. The thickness of the bottom metallic layer is formed thicker in view of the thickness reduction by the SAT.

(5) Formation of Free Layer 18 (Step S15)

The free layer 18 is formed as a multilayered structure of $Co_{90}Fe_{10}$ 1 nm/$Ni_{83}Fe_{17}$ 3.5 nm on the top metallic layer 17. In order to realize the higher MR variation ratio of the magneto-resistance effect element, the appropriate material selection for the free layer 18 in the vicinity of the spacer 16 should be considered. In this point of view, it is desired to form the NiFe alloy film or the CoFe alloy film at the interface between the free layer 18 and the spacer layer 16. The CoFe alloy film is more preferable than the NiFe alloy film. As the CoFe alloy film, the $Co_{90}Fe_{10}$ layer with a thickness of 1 nm is preferred in view of the stable soft magnetic property. Of course, the CoFe alloy layer can contain anther composition.

If the CoFe alloy layer with a composition almost equal to the one of the $Co_{90}Fe_{10}$ layer is employed, the thickness of the CoFe alloy layer is preferably set within 0.5 to 4 nm. If the CoFe alloy layer with a composition (e.g., $Co_{50}Fe_{50}$) different from the one of the $Co_{90}Fe_{10}$ layer is employed, the thickness of the CoFe alloy layer is preferably set within 0.5 to 2 nm. If the free layer 18 is made of $Fe_{50}Co_{50}$ (or $Fe_XCo_{1-X}$ (X=45 to 85)) in view of the enhancement in spin dependent interface scattering effect, it is difficult to set the thickness of the free layer 18 as thick as the thickness of the pinned layer 14 so as to maintain the soft magnetism of the free layer 18. In this case, therefore, the thickness of the free layer 18 is preferably set within 0.5 to 1 nm. If the free layer 18 is made of Fe or Fe alloy without Co, the thickness of the free layer 18 may be increased within 0.5 to 4 nm because the soft magnetism of the free layer can be maintained under good condition.

The NiFe alloy layer can maintain stably the inherent soft magnetism, but the CoFe alloy layer can not maintain stably inherent soft magnetism in comparison with the NiFe alloy layer. In this case, if the NiFe alloy layer is formed on the CoFe alloy layer, the soft magnetism of the CoFe alloy can be compensated with the soft magnetism of the NiFe alloy layer. In this point of view, the formation of the NiFe alloy layer at the interface between the free layer 18 and the spacer layer 16 can develop the MR variation ratio of the spin valve film, that is, the magneto-resistance effect element.

The composition of the NiFe alloy layer is preferably set to $Ni_XFe_{100-X}$ (X=75 to 85%). Particularly, the composition of the NiFe alloy layer is preferably set to a Ni-rich composition in comparison with the normal composition of $Ni_{81}Fe_{19}$ (e.g., $Ni_{83}Fe_{17}$) so as to realize the non-magnetostriction of the NiFe layer. The magnetostriction of the NiFe alloy layer is shifted positive when the NiFe alloy layer is formed on the CCP-structured spacer 16 in comparison with the magnetostriction of the NiFe alloy layer when the NiFe alloy layer is formed on a Cu spacer. In this point of view, the composition of the NiFe alloy layer is shifted to a Ni-rich composition in advance so as to cancel the positive magnetostriction of the NiFe alloy layer formed on the spacer layer 16 because the Ni-rich NiFe alloy layer can exhibit the negative magnetostriction.

The thickness of the NiFe layer may be set preferably within 2 to 5 nm (e.g., 3.5 nm). Without the NiFe layer, a plurality of CoFe layers or Fe layers with a thickness of 1 to 2 nm and a plurality of thinner Cu layers with a thickness of 0.1 to 0.8 nm are alternately stacked one another, thereby forming the free layer 18.

(6) Formation of Cap Layer 19 and Top Electrode (Step S16)

The cap layer 19 is formed as a multilayer of Cu 1 nm/Ru 10 nm on the free layer 18. Then, the top electrode 20 is formed on the cap layer 19 so as to flow a current to the spin valve film in the direction perpendicular to the film surface thereof.

EXAMPLES

The present invention will be described in detail in view of Examples. The fundamental structure of the magneto-resistance effect element in Examples will be described hereinafter.

| Bottom electrode 11 | |
| --- | --- |
| Underlayer 12: | Ta 5 nm/Ru 2 nm |
| Pinning layer 13: | $Ir_{22}Mn_{78}$ 7 nm |
| Pinned layer 14: | $Co_{75}Fe_{25}$ 3.2 nm/Ru 0.9 nm/$Fe_{50}Co_{50}$ 1 nm/Cu 0.25 nm × 2/$Fe_{50}Co_{50}$ 1 nm |
| Metallic layer 15: | Cu 0.5 nm/SAT |
| Spacer layer 16: | insulating layer 161 of $Al_2O_3$ and current confining path 162 of Cu which are treated by means of PIT/IAO) |
| Metallic layer 17: | Cu 0.25 nm |
| Free layer 18: | $Co_{90}Fe_{10}$ 1 nm/$Ni_{83}Fe_{17}$ 3.5 nm |
| Cap layer 19: | Cu 1 nm/Ru 10 nm |
| Top electrode 20 | |

The forming process of the spacer layer 16 will be described. The forming processes of other layers can be conducted by means of conventional techniques and thus, will be omitted. In this Examples, the SAT was carried out by means of the RF plasma treatment. The SAT was also carried out in a metallic film-forming chamber with the RF biasing mechanism under the condition that the flow rate of Ar gas was set to 40 sccm, the RF power was set to 20 W or 40 W, the biasing voltage was set to 80 V or 120 V and the treatment period was set to 120 seconds.

Reference Example 0

Refer to FIG. 5

In this Example, the spacer layer was formed without SAT.

Example (1)

Figure 6:
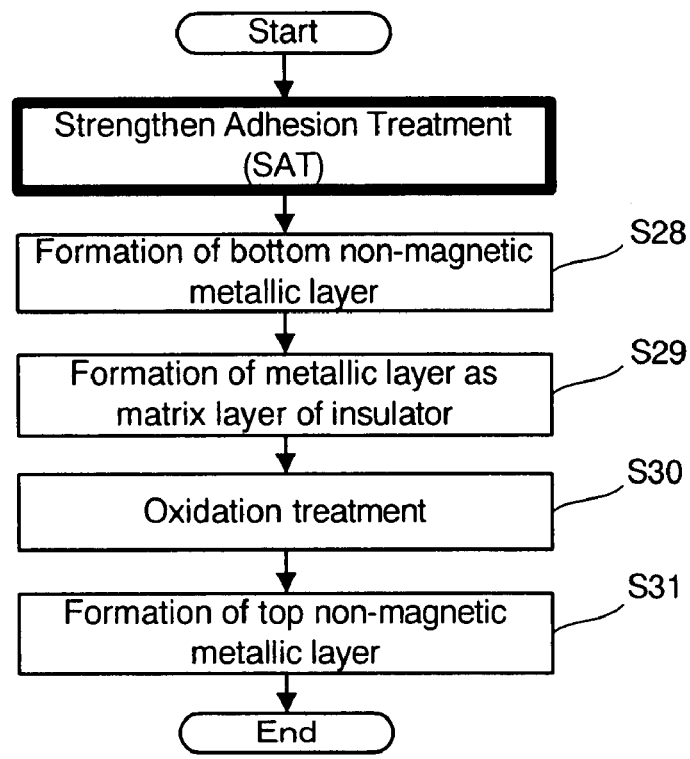
FIG. 6 is a flowchart showing a concrete forming process of the magneto-resistance effect element in FIG. 1 containing an adhesion enhancing treatment.
Figure 6:
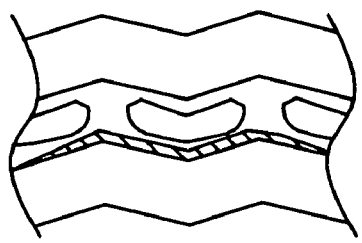

Refer to FIG. 6

The top pinned layer was formed as a multilayered structure of ($Fe_{50}Co_{50}$ 1 nm/Cu 0.25 nm)×2/$Fe_{50}Co_{50}$ 1.5 nm. Then, the SAT was carried out for the top pinned layer by means of RF plasma treatment under the condition that the RF power was set to 40 W and the biasing voltage was set to 110 V. Since the $Fe_{50}Co_{50}$ layer was reduced in thickness by 0.5 nm through the SAT using the RF plasma treatment, the top pinned layer was formed as a multilayered structure of ($Fe_{50}Co_{50}$ 1 nm/Cu 0.25 nm)×2/$Fe_{50}Co_{50}$ 1 nm after the SAT.

Example (2)

Figure 7:
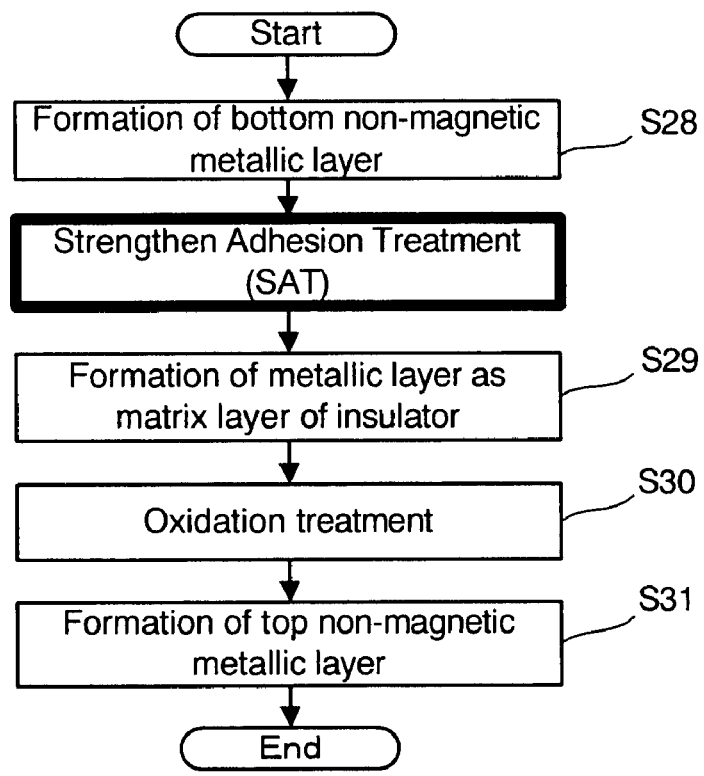
FIG. 7 is another flowchart showing a concrete forming process of the magneto-resistance effect element in FIG. 1 containing an adhesion enhancing treatment.
Figure 7:
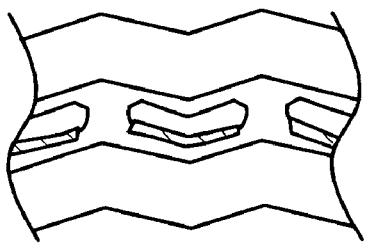

Refer to FIG. 7

The Cu layer with a thickness of 1.1 nm was formed and the SAT was carried our for the Cu layer. The SAT was carried out by means of RF plasma treatment under the condition that the RF power was set to 40 W and the biasing voltage was set to 110 V. The Cu layer was reduced in thickness by 0.5 nm through the SAT using the RF plasma treatment so that the thickness of the remaining Cu layer as the bottom metallic layer was set to 0.6 nm.

Example (3)

Figure 8:
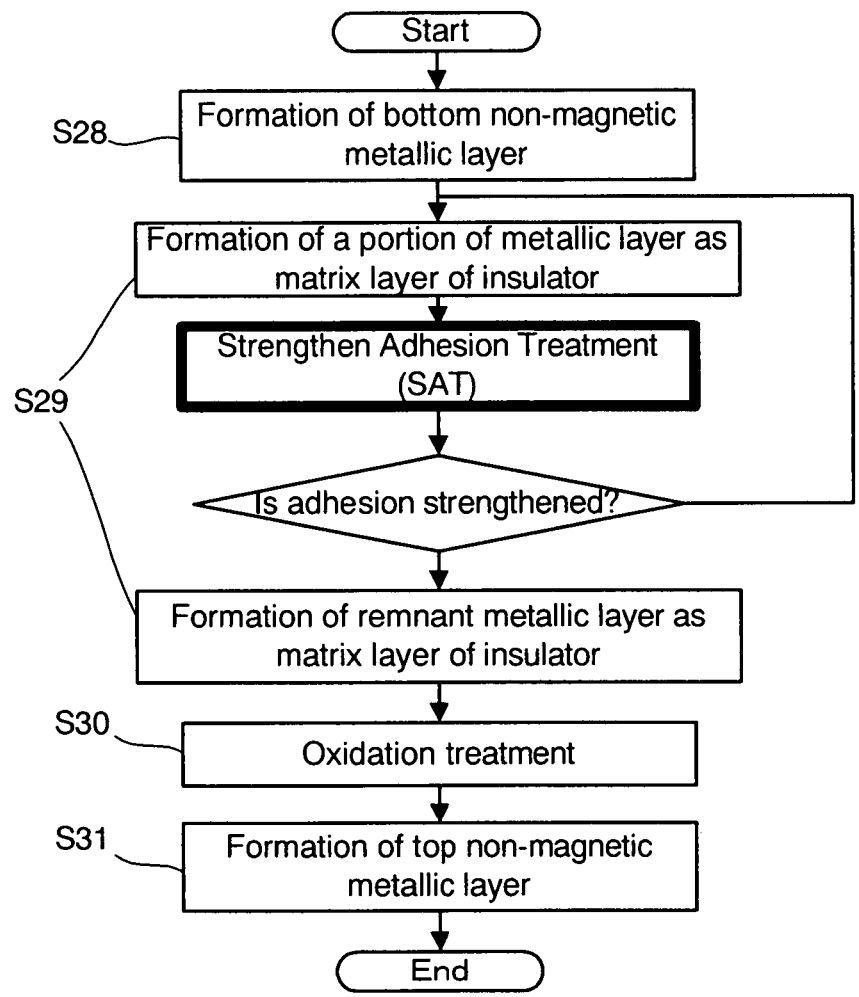
FIG. 8 is still another flowchart showing a concrete forming process of the magneto-resistance effect element in FIG. 1 containing an adhesion enhancing treatment.
Figure 8:
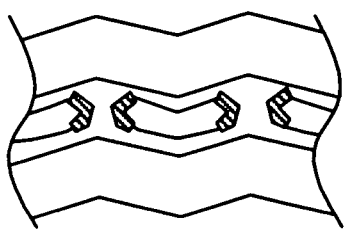

Refer to FIG. 8

The AlCu layer with a thickness of 0.2 nm as a matrix layer of the insulating layer was formed on the bottom metallic layer made of Cu and the SAT was carried our for the AlCu layer. The SAT was carried out by means of RF plasma treatment under the condition that the RF power was set to 20 W and the biasing voltage was set to 80 V. Since the AlCu layer might be diminished through the SAT using the RF plasma treatment, an additional AlCu layer was formed in a thickness of 97 nm.

Example (4)

Refer to FIG. 9

The extreme thin oxide layer was formed and the SAT was carried our for the oxide layer. The SAT was carried out by means of RF plasma treatment under the condition that the RF power was set to 40 W and the biasing voltage was set to 110V.

Example (5)

Refer to FIG. 10

The Cu layer with a thickness of 0.75 nm was formed as the top metallic layer and the SAT was carried our for the Cu layer. The SAT was carried out by means of RF plasma treatment under the condition that the RF power was set to 40 W and the biasing voltage was set to 110 V. Since the Cu layer was reduced in thickness by 0.5 nm, the remaining Cu layer with a thickness of 0.25 nm constituted the top metallic layer.

Example (6)

Refer to FIG. 11

The spacer layer was formed by the combination of Examples (1) to (5).

Evaluation of Examples

Examples were evaluated with Comparative Example. In Examples and Comparative Example, the spacer layer was structured as a multilayer of Cu/AlCu-NOL/Cu. In Examples (1) to (6), the SAT was carried out for the spacer layer 16, and in Comparative Example, the SAT was not carried out for the spacer layer 16.

In the evaluation, the element area of the magneto-resistance effect element was set to a size of 0.4 μm×0.4 μm. In Examples, the element resistance RA was 500 mΩ/μm, the MR variation ratio was 9% and the element resistance variation ΔRA was 45 mΩ/μm$^2$. These characteristics are almost equal to the ones in Comparative Example.

Then, the reliability of the magneto-resistance effect element was investigated. The current flow test was carried out under the condition that the temperature was 130° C., and the biasing voltage was 140 mV. In this investigation, the current flow condition was set to a severe one so as to obtain the result in the current flow test of the element immediately. The current flow direction was set so that the current was flowed from the pinned layer 14 to the free layer 18. In this case, the electron flow was generated from the free layer 18 to the pinned layer 14 opposite of the current direction.

The current flow direction is favorable for the reduction of the spin transfer noise. Allegedly, the spin transfer torque effect becomes large when the current is flowed from the free layer 18 to the pinned layer 14 (the electron flow is generated from the pinned layer 14 to the free layer 18), which leads to the noise generation in the CCP-CPP element. In this point of view, it is desired that the current is flowed from the pinned layer to the free layer.

As described above, the test condition was set to a severe one for the acceleration of the reliability test for the magneto-resistance effect element. In this embodiment, the chip size of the element to be employed in a magnetic head was set larger than a normal chip size (in real, within 0.1 μm×0.1 μm). The amount of current flow is increased under a given biasing voltage and thus, the heat radiation performance of the element may be deteriorated as the chip size of the element is increased. In this point of view, in Examples, the thus generated Joule heat affects the element remarkably in comparison with the real element to be employed in the magnetic head. In view of the Joule heat, therefore, the reliability of the element is tested under a severe condition. Then, the biasing voltage is set larger than a normal biasing voltage and the testing temperature is set higher than a normal temperature, the reliability of the element results in being tested under a more severe condition so as to accelerate the reliability test and shorten the testing period of time.

Under these circumstances, the reliability in the elements in Reference Example (0) and Examples (1) to (5) were investigated. Concretely, the output of the element was normalized by the initial output of the element, and the variation in output of the element was followed. The reliability of the element is increased as the variation in output of the element is decreased.

As a result, the reliability in the elements in Examples was enhanced. Therefore, it was confirmed that the reliability of the element can be enhanced irrespective of the timing and position of the SAT. Particularly, in the case that the SAT is carried out for the bottom metallic layer and the AlCu layer, the reliability in the element is remarkably enhanced. More particularly, in the case that the SAT is carried out under the combination of Examples (1) to (5), the reliability in the element is most remarkably enhanced.

Herein, it is possible to add an additional layer or an additive in the element, instead of the SAT.

Concretely, the additional layer made of Mo, Mg, V, W, Si, Ti, Zr, Cr, Hf, Ta is formed at the corresponding interface of the element. The thickness of the additional layer is set within a thickness range of half atomic layer through three atomic layers. In this case, the adhesion at the interface is enhanced so that the reliability in the element can be enhanced.

Then, the additive may be added to the layers composing the spacer layer, that is, the bottom metallic layer, the metallic layer as a matrix layer of the insulating layer and/or the top metallic layer by 1 to 15 at %.

In Examples, the insulating layer of the spacer layer is made of the oxide, but may be made of a nitride. In the latter case, a nitriding gas is introduced into the chamber instead of the oxidizing gas in the IAO process. Moreover, an oxidizing gas and a nitriding gas are introduced into the chamber to form the insulating layer of an oxynitride. In these cases, the adhesion of the spacer layer can be enhanced.

If the accelerating condition is mitigated, the deterioration degree in output of the element is also mitigated even in Reference Example (0) so that the reliability of the element can be enhanced. In this point of view, it is confirmed that the above-described accelerating condition is a severe condition.

The higher reliability of the element under the severe condition means that the element can be employed under an environmental condition requiring higher reliability. In view of the application of the element to a high density recording head, the reliability of the recording head can be enhanced remarkably in comparison of a conventional high density recording head. Thus, the high density recording head can be applied for a car navigation system requiring a severe use condition such as high temperature environment or for an HDD (Hard disk drive) of a server or an enterprise which is operated at high speed.

Second Embodiment

Figure 14:
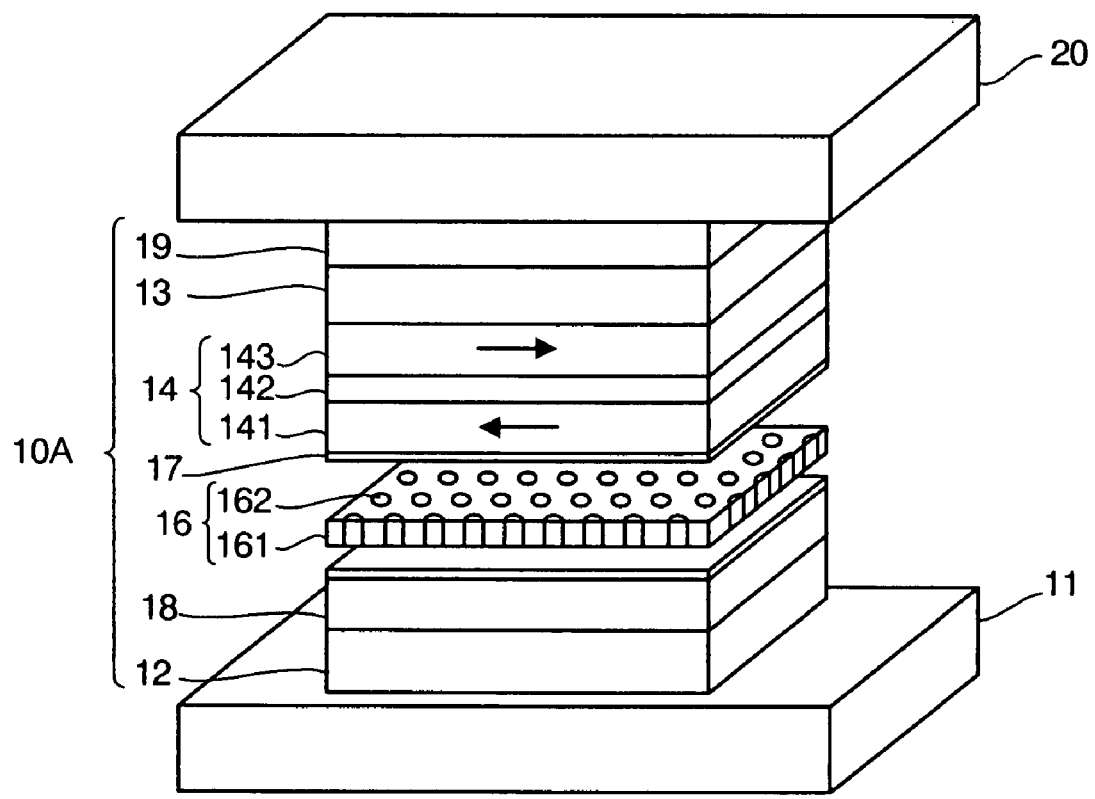
FIG. 14 is a perspective view illustrating a second embodiment of the magneto-resistance effect element by using the present invention.
Figure 15:
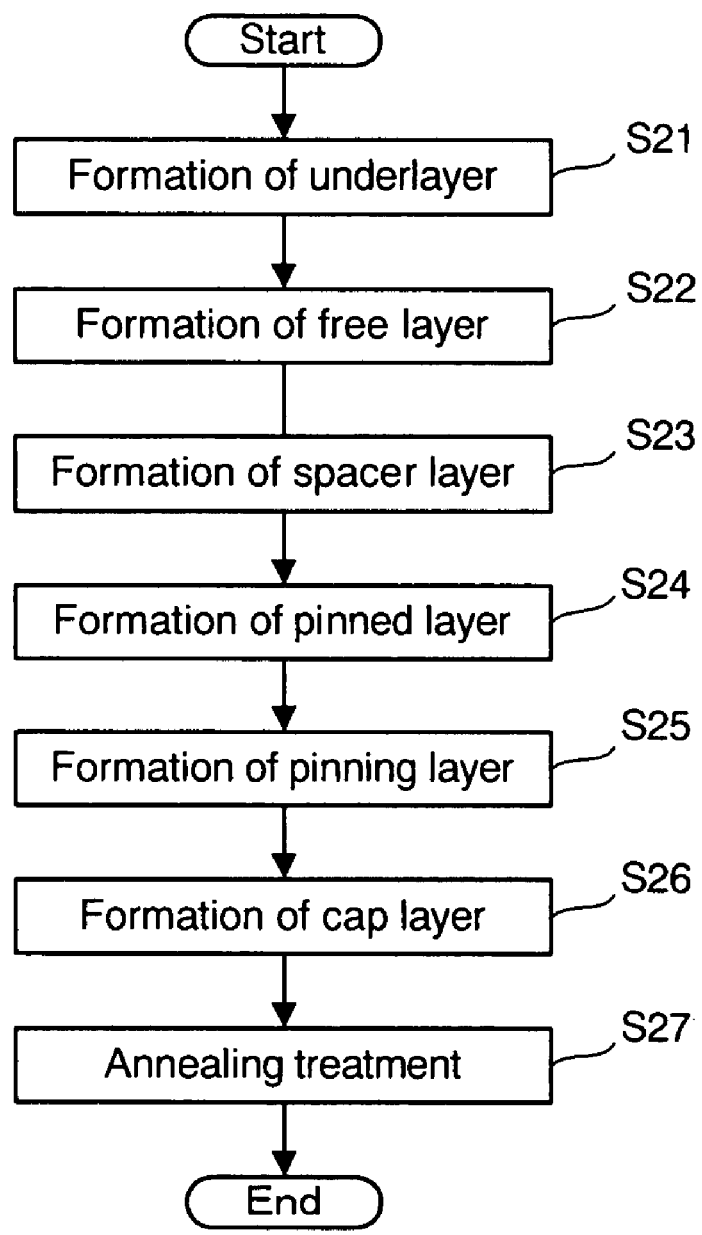
FIG. 15 is a flowchart showing a manufacturing process of the magneto-resistance effect element in FIG. 14.

FIG. 14 is a perspective view illustrating a second embodiment of the magneto-resistance effect element by using the present invention. FIG. 15 is a flowchart showing a manufacturing process of the magneto-resistance effect element in FIG. 14. The magneto-resistance effect element is a top type CCP-CPP element where the pinned layer 14 is located above the free layer 18. Namely, the SAT can be carried out for the top type CCP-CPP element in addition to the bottom type CCP-CPP element where the pinned layer 14 is located below the free layer 18.

With the top type spin valve film, the pinned layer 14 requires the stress-controlling treatment and the free layer 18 does not require the stress-controlling treatment because the crystallinity of the magnetic layer (pinned layer 14) to be formed on the spacer layer may be deteriorated. In FIG. 14, the bottom pinned layer contains the stress-controlling portion.

With the top type CCP-CPP element, the SAT may be carried out by means of ion beam treatment, plasma treatment or thermal treatment in the same manner as the bottom type CCP-CPP element.

As shown in FIG. 15, in the case that the top type CCP-CPP element is manufactured, the layers located between the underlayer 12 and the cap layer 19 are subsequently formed in reverse to the layers between the underlayer 12 and the cap layer 19 as shown in FIG. 14. Herein, the formation turn of the bottom metallic layer 15 and the top metallic layer 17 is not reverse in relation to the formation of the spacer layer 16. Therefore, the spacer layer 16 is formed in accordance with the steps shown in FIGS. 6 to 11.

Figure 12:
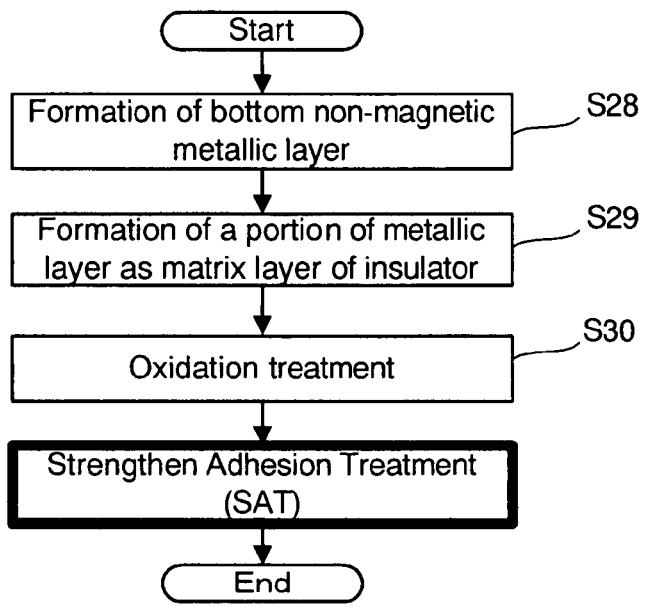
FIG. 12 is a further flowchart showing a concrete forming process of the magneto-resistance effect element in FIG. 1 containing an adhesion enhancing treatment.
Figure 12:
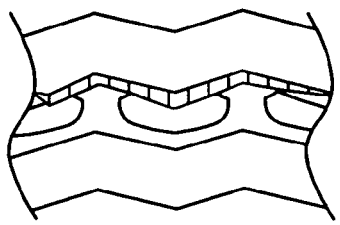

In the top type CCP-CPP element, the bottom metallic layer 15 and the top metallic layer (Cu layer) 17, which are located below and above the spacer layer 16, can function in the same manner as the bottom type CCP-CPP element. The bottom metallic layer 15 located below the spacer layer 16 is an essential element for the formation of the current confining path 162, and the top metallic layer 17 located above the spacer layer 16 is not an essential element. In the latter case, the SAT can be carried out in the same manner as shown in FIG. 12.

(Application of Magneto-Resistance Effect Element)

The application of the magneto-resistance effect element by using this embodiment will be described hereinafter, In view of high density recording, the element resistance RA is set preferably to 500 mΩ/μm or below, more preferably to 300 mΩ/μm or below. In the calculation of the element resistance RA, the effective area A in current flow of the spin valve film is multiplied to the resistance R of the CPP-CPP element. Herein, the element resistance R can be directly measured, but attention should be paid to the effective area A because the effective area A depends on the element structure.

If the whole area of the spin valve film is effectively sensed by current through patterning, the whole area of the spin valve film corresponds to the effective area A. In this case, the whole area of the spin valve film is set to 0.04 μm² or below in view of the appropriate element resistance, and to 0.02 μm² or below in view of the recording density of 200 Gbpsi or over.

If the area of the bottom electrode 11 or the top electrode 20 is set smaller than the whole area of the spin valve film, the area of the bottom electrode 11 or the top electrode 20 corresponds to the effective area A. If the area of the bottom electrode 11 is different from the area of the top electrode 20, the smaller area of either of the bottom electrode 11 or the top electrode 20 corresponds to the effective area A. As described above, the smaller area is set to 0.04 μm² or below in view of the appropriate element resistance Referring to FIGS. 16 and 17 since the smallest area of the spin valve film 10 corresponds to the contacting area with the top electrode 20 as apparent from FIG. 16, the width of the smallest area can be considered as a track width Tw. Then, since the smallest area of the spin valve film 10 in MR height direction also corresponds to the contacting area with the top electrode 20 as apparent from FIG. 17, the width of the smallest are can be considered as a height length D. In this case, the effective area A can be calculated on the equation of A=Tw×D.

In the magneto-resistance effect element by using this embodiment, the resistance R between the electrodes can be reduced to 100Ω or below, which corresponds to the resistance between the electrode pads in the reproducing head attached to the forefront of a head gimbal assembly (HGA), for example.

It is desired that the magneto-resistance effect element is structured in fcc (111) orientation when the pinned layer 14 or the free layer 18 has the fcc-structure. It is also desired that the magneto-resistance effect element is structured in bcc (100) orientation when the pinned layer 14 or the free layer 18 has the bcc-structure. It is also desired that the magneto-resistance effect element is structured in hcp (001) orientation when the pinned layer 14 or the free layer 18 has the hcp-structure.

The crystalline orientation of the magneto-resistance effect element by using this embodiment is preferably 4.5 degrees or below, more preferably 3.5 degrees or below and particularly 3.0 degree or below in view of the dispersion of orientation. The crystalline orientation can be measured from the FWHM of X-ray rocking curve obtained from the θ-2θ measurement in X-ray diffraction. The crystalline orientation can be also measured by the spot scattering angle originated from the nano-diffraction spots of the element cross section.

Depending on the kind of material of the antiferromagnetic film, since the lattice spacing of the antiferromagnetic film is different from the lattice spacing of the pinned layer 14/CCP-NOL layer 16/free layer 18, the dispersion in crystalline orientation can be obtained between the antiferromagnetic film and the pinned layer 14/CCP-NOL layer 16/free layer 18. For example, the lattice spacing of the PtMn antiferromagnetic layer is often different from the lattice spacing of the pinned layer 14/CCP-NOL layer 16/free layer 18. In this point of view, since the PtMn layer is formed thicker, the PtMn layer is suitable for the measurement in dispersion of the crystal orientation. With the pinned layer 14/CCP-NOL layer 16/free layer 18, the pinned layer 14 and the free layer 18 may have the respective different crystal structures of bcc-structure and fcc-structure. In this case, the dispersion angle in crystal orientation of the pinned layer 14 may be different from the dispersion angle in crystal orientation of the free layer 18.

(Magnetic Head)

Figure 16:
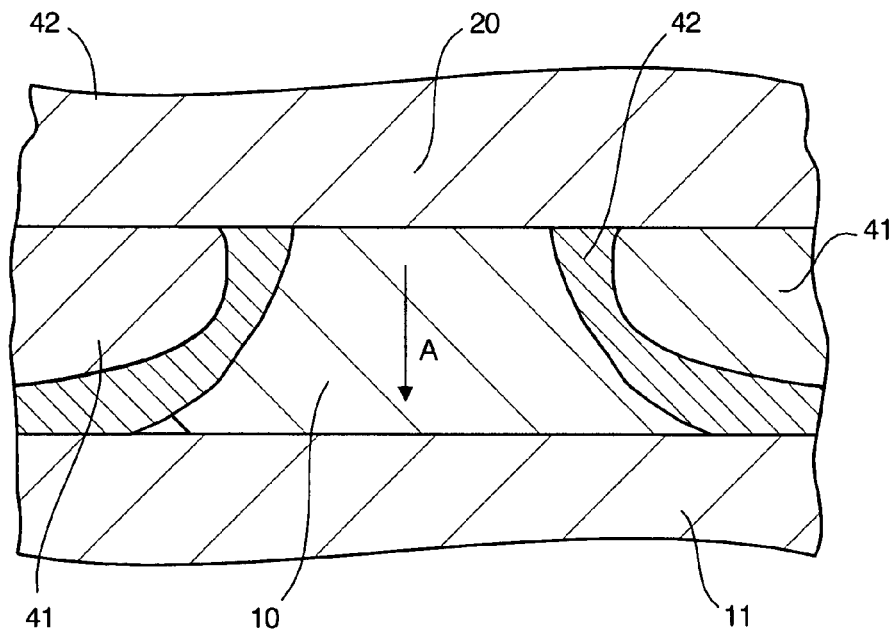
FIG. 16 is a cross sectional view showing the state where the magneto-resistance effect element as described in an embodiment of the present invention is incorporated in a magnetic head.
Figure 17:
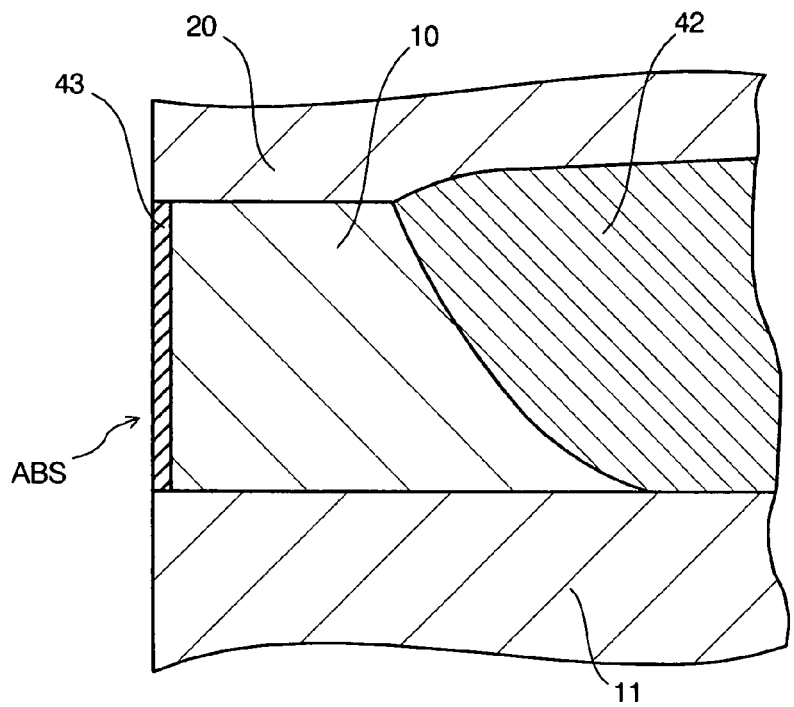
FIG. 17 is another cross sectional view showing the state where the magneto-resistance effect element as described in an embodiment of the present invention is incorporated in a magnetic head.

FIGS. 16 and 17 are cross sectional views showing the state where the magneto-resistance effect element by using this embodiment is incorporated in a magnetic head. FIG. 16 is a cross sectional view showing the magneto-resistance effect element, taken on the surface almost parallel to the ABS (air bearing surface) opposite to a (not shown) magnetic recording medium. FIG. 17 is a cross sectional view showing the magneto-resistance effect element, taken on the surface almost perpendicular to the ABS.

The magnetic head shown in FIGS. 16 and 17 has a so-called hard abutted structure. The magneto-resistance effect film 10 is the CCP-CPP film as described above. The bottom electrode 11 and the top electrode 20 are provided on the top surface and the bottom surface of the magneto-resistance effect film 10, respectively. In FIG. 16, the biasing magnetic applying films 41 and the insulating films 42 are formed at the both sides of the magneto-resistance effect film 10. In FIG. 17, the protective layer 43 is formed on the ABS of the magneto-resistance effect film 10.

The sense current is flowed along the arrow A through the magneto-resistance effect film 10 between the bottom electrode 11 and the top electrode 20, that is, in the direction perpendicular to the film surface of the magneto-resistance effect film 10. Moreover, a given biasing magnetic field is applied to the magneto-resistance effect film 10 from the biasing magnetic field applying films 41 so as to render the domain structure of the free layer 18 of the film 10 a single domain structure through the control of the magnetic anisotropy of the free layer 18 and stabilize the magnetic domain structure of the free layer 18. In this case, the Barkhausen noise due to the shift of magnetic wall in the magneto-resistance effect film 10 can be prevented.

Since the S/N ratio of the magneto-resistance effect film 10 is enhanced, the magnetic head including the magneto-resistance effect film 10 can realize the high sensitive magnetic reproduction.

(Magnetic Head and Magnetic Recording/Reproducing Device)

The magneto-resistance effect element is installed in advance in an all-in-one magnetic head assembly allowing both the recording/reproducing, and mounted as the head assembly at the magnetic recording/reproducing device.

Figure 18:
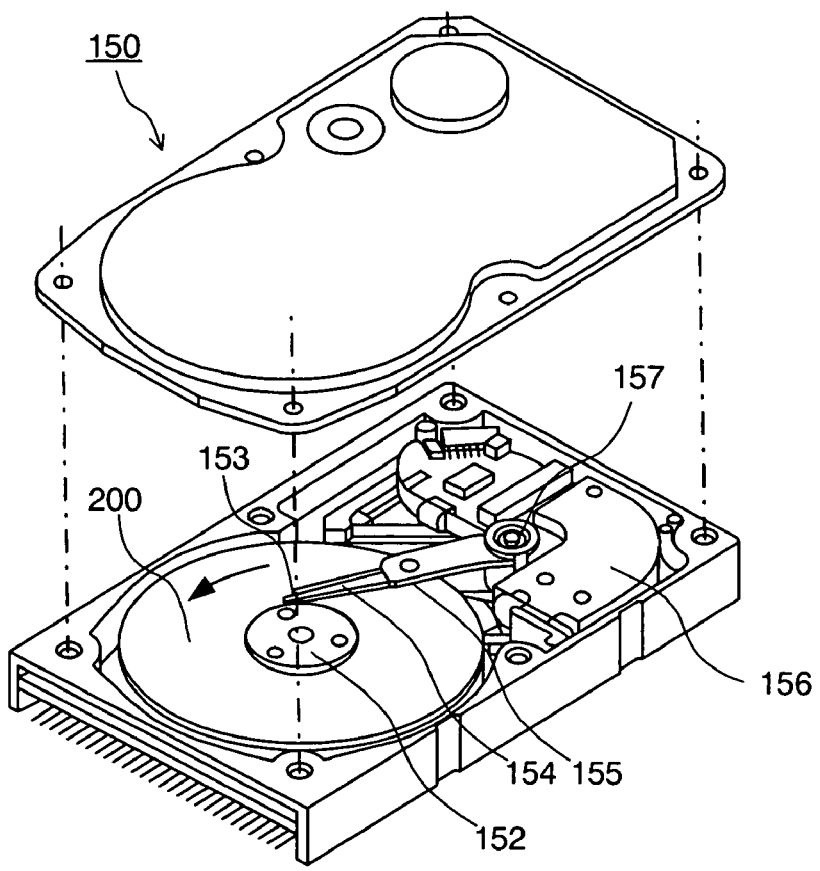
FIG. 18 is a perspective view illustrating an essential part of a magnetic recording/reproducing device by using the present invention.

FIG. 18 is a perspective view illustrating the schematic structure of the magnetic recording/reproducing device. The magnetic recording/reproducing device 150 illustrated in FIG. 18 constitutes a rotary actuator type magnetic recording/reproducing device. In FIG. 18, a magnetic recording disk 200 is mounted to a spindle 152 to be turned in the direction designated by the arrow A by a motor (not shown) which is driven in response to control signals from a drive unit controller (not shown). In FIG. 18, the magnetic recording/reproducing apparatus 150 may be that provided with a single magnetic recording disk 200, but with a plurality of magnetic recording disks 200.

A head slider 153 recording/reproducing information to be stored in the magnetic recording disk 200 is mounted on a tip of a suspension 154 of a thin film type. The head slider 153 mounts at the tip the magnetic head containing the magnetic resistance effect element as described in above embodiments.

When the magnetic recording disk 200 is rotated, such a surface (ABS) of the head slider 153 as being opposite to the magnetic recording disk 200 is floated from on the main surface of the magnetic recording disk 200. Alternatively, the slider may constitute a so-called "contact running type" slider such that the slider is in contact with the magnetic recording disk 200.

The suspension 154 is connected to one edge of the actuator arm 155 with a bobbin portion supporting a driving coil (not shown) and the like. A voice coil motor 156 being a kind of a linear motor is provided at the other edge of the actuator arm 155. The voice coil motor 156 is composed of the driving coil (not shown) wound around the bobbin portion of the actuator arm 155 and a magnetic circuit with a permanent magnet and a counter yoke which are disposed opposite to one another so as to sandwich the driving coil.

The actuator arm 155 is supported by ball bearings (not shown) provided at the upper portion and the lower portion of the spindle 157 so as to be rotated and slid freely by the voice coil motor 156.

Figure 19:
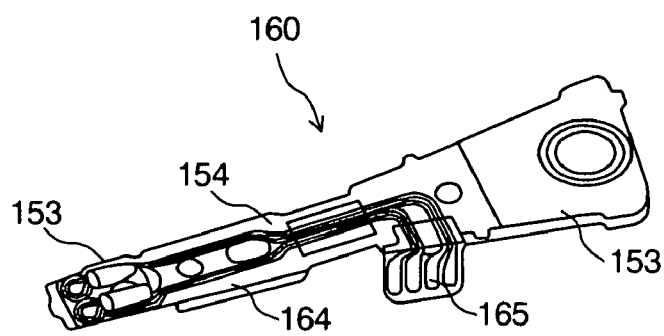
FIG. 19 is an enlarged perspective view illustrating the magnetic head assembly of the magnetic recording/reproducing device which is located forward from the actuator arm, as viewed from the side of the disk.

FIG. 19 is an enlarged perspective view illustrating a portion of the magnetic head assembly positioned at the tip side thereof from the actuator arm 155, as viewed from the side of the magnetic recording disk 200. As illustrated in FIG. 19, the magnetic head assembly 160 has the actuator arm 155 with the bobbin portion supporting the driving coil and the like. The suspension 154 is connected with the one edge of the actuator arm 155. Then, the head slider 153 with the magnetic head containing the magneto-resistance effect element as defined in above-embodiments is attached to the tip of the suspension 154. The suspension 154 includes a lead wire 164 for writing/reading signals, where the lead wire 164 is electrically connected with the respective electrodes of the magnetic head embedded in the head slider 153. In the drawing, reference numeral "165" denotes an electrode pad of the assembly 160.

In the magnetic recording/reproducing device illustrated in FIGS. 18 and 19, since the magneto-resistance effect element as described in the above embodiments is installed, the information magnetically recorded in the magnetic recording disk 200 can be read out properly.

(Magnetic Memory)

The magneto-resistance effect element as described above can constitute a magnetic memory such as a magnetic random access memory (MRAM) where memory cells are arranged in matrix.

Figure 20:
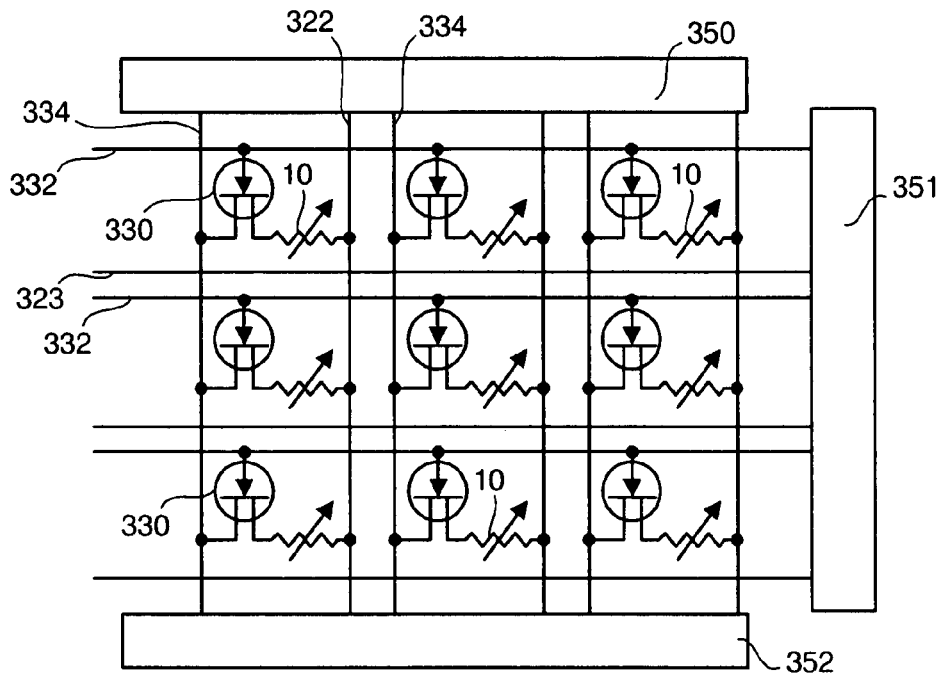
FIG. 20 is a view illustrating a magnetic memory matrix by using the present invention.

FIG. 20 is a view illustrating an embodiment of the magnetic memory matrix by using the present invention. This drawing shows a circuit configuration when the memory cells are arranged in an array. In order to select one bit in the array, a column decoder 350 and a line decoder 351 are provided, where a switching transistor 330 is turned ON by a bit line 334 and a word line 332 and to be selected uniquely, so that the bit information recorded in a magnetic recording layer (free layer) in the magneto-resistance effect film 10 can be readout by being detected by a sense amplifier 352. In order to write the bit information, a writing current is flowed in a specific write word line 323 and a bit line 322 to generate a magnetic field for writing.

Figure 21:
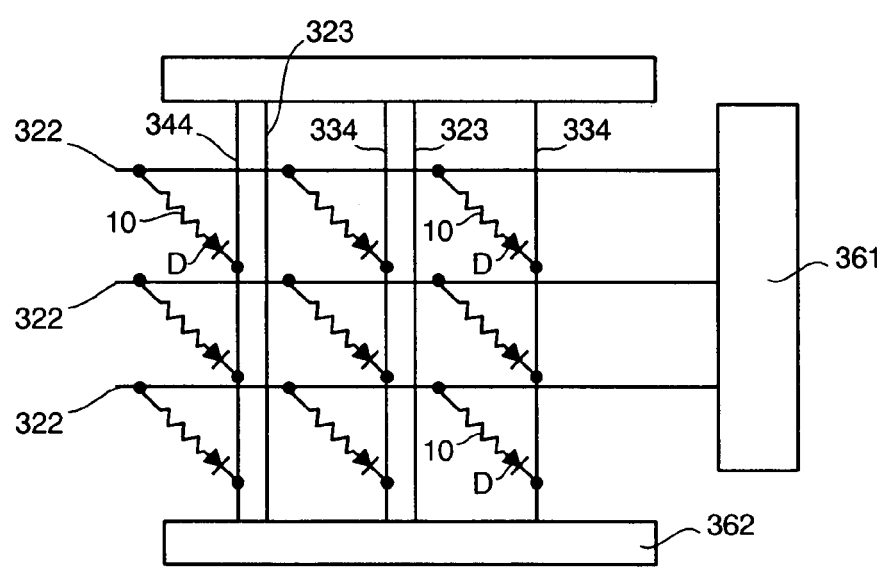
FIG. 21 is a view illustrating another magnetic memory matrix by using the present invention.

FIG. 21 is a view illustrating another embodiment of the magnetic memory matrix by using the present invention. In this case, a bit line 322 and a word line 334 which are arranged in matrix are selected by decoders 360, 361, respectively, so that a specific memory cell in the array is selected. Each memory cell is configured such that the magneto-resistance effect film 10 and a diode D is connected in series. Here, the diode D plays a role of preventing a sense current from detouring in the memory cell other than the selected magneto-resistance effect film 10. A writing is performed by a magnetic field generated by flowing the writing current in the specific bit line 322 and the word line 323, respectively.

Figure 22:
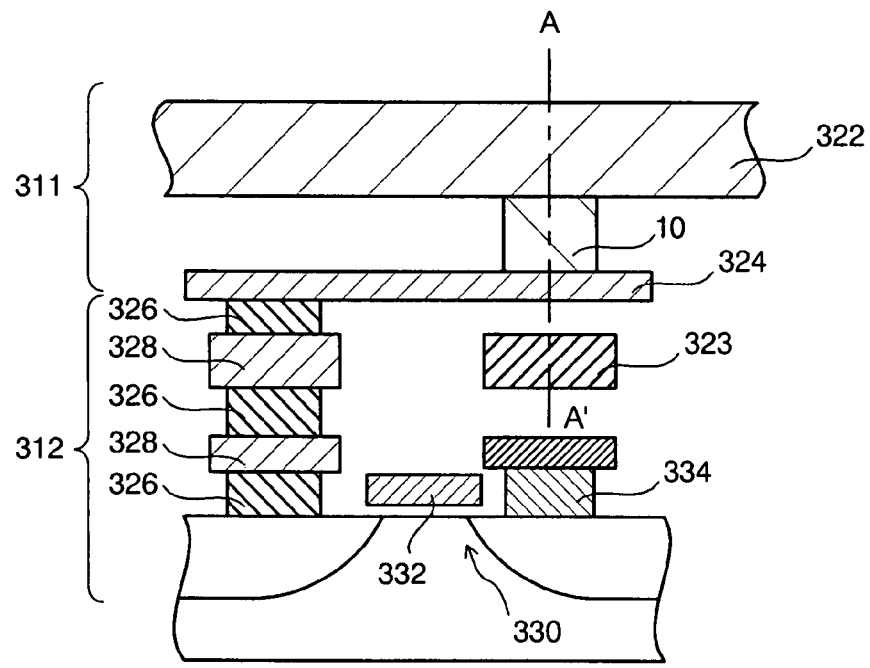
FIG. 22 is a cross sectional view illustrating an essential part of the magnetic memory.
Figure 23:
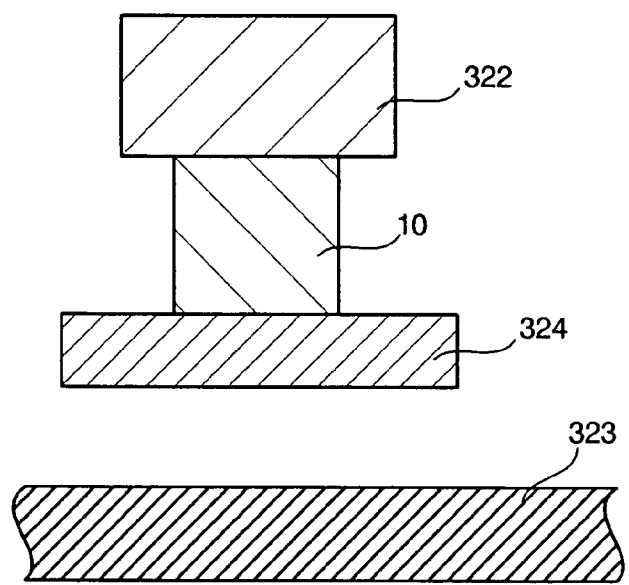
FIG. 23 is a cross sectional view of the magnetic memory illustrated in FIG. 22, taken on line "A-A'".

FIG. 22 is a cross sectional view illustrating a substantial portion of the magnetic memory in an embodiment by using the present invention. FIG. 23 is a cross sectional view of the magnetic memory illustrated in FIG. 22, taken on line "A-A'". The configuration shown in these drawings corresponds to a 1-bit memory cell included in the magnetic memory shown in FIG. 21 or FIG. 22. This memory cell includes a memory element part 311 and an address selection transistor part 312.

The memory element part 311 includes the magneto-resistance effect film 10 and a pair of wirings 322, 324 connected to the magneto-resistance effect film 10. The magneto-resistance effect film 10 is the magneto-resistance effect element (CCP-CPP element) as described in the above embodiments.

Meanwhile, in the address selection transistor part 312, a transistor 330 having connection therewith via a via 326 and an embedded wiring 328 is provided. The transistor 330 performs switching operations in accordance with voltages applied to a gate 332 to control the opening/closing of the current confining path between the magneto-resistance effect film 10 and the wiring 334.

Further, below the magneto-resistance effect film 10, a write wiring 323 is provided in the direction substantially orthogonal to the wiring 322. These write wirings 322, 323 can be formed of, for example, aluminum (Al), copper (Cu), tungsten (W), tantalnum (Ta) or an alloy containing any of these elements.

In the memory cell of such a configuration, when writing bit information into the magneto-resistance effect element 10, a writing pulse current is flowed in the wirings 322, 323, and a synthetic magnetic field induced by the writing current is applied to appropriately invert the magnetization of a recording layer of the magneto-resistance effect element 10.

Further, when reading out the bit information, a sense current is flowed through the magneto-resistance effect element 10 including the magnetic recording layer and a lower electrode 324 to measure a resistance value of or a fluctuation in the resistance values of the magneto-resistance effect element 10.

The magnetic memory by using the embodiment can assure writing and reading by surely controlling the magnetic domain of the recording layer even though the cell is miniaturized in size, with the use of the magneto-resistance effect element (CCP-CPP element) with the above-described embodiment.

Another Embodiment

Although the present invention was described in detail with reference to the above examples, this invention is not limited to the above disclosure and every kind of variation and modification may be made without departing from the scope of the present invention.

The concrete structure of the magneto-resistance effect element, and the shape and material of the electrodes, the magnetic field biasing films and the insulating layer can be appropriately selected among the ones well known by the person skilled in the art. In these cases, the intended magneto-resistance effect element by using the present invention can be obtained so as to exhibit the same effect/function as described above.

When the magneto-resistance effect element is applied for a reproducing magnetic head, the detecting resolution of the magnetic head can be defined by applying magnetic shielding for the upper side and the lower side of the magneto-resistance effect element. Moreover, the magneto-resistance effect element can be applied for both of a longitudinal magnetic recording type magnetic head and a vertical magnetic recording type magnetic recording type magnetic head. Also, the magneto-resistance effect element can be applied for both of a longitudinal magnetic recording/reproducing device and a vertical magnetic recording/reproducing device. The magnetic recording/reproducing device may be a so-called stationary type magnetic device where a specific recording medium is installed therein or a so-called removable type magnetic device where a recording medium can be replaced.

What is claimed is:

1. A method for manufacturing a magneto-resistance effect element, comprising steps of:
   forming a fixed magnetization layer;
   forming a free magnetization layer; and
   forming a spacer layer with an insulating layer and a non-magnetic metallic path penetrating through said insulating layer, comprising steps of:
   forming a first non-magnetic metallic layer;
   forming a metallic layer on a surface of said first non-magnetic metallic layer;
   irradiating, onto said metallic layer, ions or plasma including at least one of oxygen and nitrogen and at least one selected from the group consisting of Ar, Xe, He, Ne, Kr so as to convert said metallic layer into said insulating layer and said non-magnetic metallic path containing said first non-magnetic metallic layer;
   forming a second non-magnetic metallic layer on said non-magnetic metallic path; and
   irradiating ions or plasma onto said fixed magnetization layer.

* * * * *